United States Patent
Sugawa et al.

(10) Patent No.: US 7,800,673 B2
(45) Date of Patent: Sep. 21, 2010

(54) SOLID-STATE IMAGING DEVICE, OPTICAL SENSOR AND METHOD OF OPERATING SOLID-STATE IMAGING DEVICE

(75) Inventors: Shigetoshi Sugawa, Miyagi (JP); Satoru Adachi, Ibaraki (JP); Kyoichi Yahata, Ibaraki (JP); Tatsuya Terada, Ibaraki (JP)

(73) Assignee: National University Corporation Tohoku University, Miyagi (JP)

( * ) Notice: Subject to any disclaimer, the term of this patent is extended or adjusted under 35 U.S.C. 154(b) by 885 days.

(21) Appl. No.: 10/592,590

(22) PCT Filed: Apr. 12, 2005

(86) PCT No.: PCT/JP2005/007066
§ 371 (c)(1),
(2), (4) Date: Nov. 8, 2006

(87) PCT Pub. No.: WO2005/101816
PCT Pub. Date: Oct. 27, 2005

(65) Prior Publication Data
US 2008/0266434 A1    Oct. 30, 2008

(30) Foreign Application Priority Data
Apr. 12, 2004  (JP) ............... 2004-116906
Nov. 5, 2004   (JP) ............... 2004-322768

(51) Int. Cl.
*H04N 3/14* (2006.01)
*H04N 5/335* (2006.01)

(52) U.S. Cl. .............. 348/308; 348/297; 348/302; 250/208.1

(58) Field of Classification Search ......... 348/294–310; 250/208.1
See application file for complete search history.

(56) References Cited

U.S. PATENT DOCUMENTS
6,307,195 B1 * 10/2001 Guidash ............... 250/208.1

(Continued)

FOREIGN PATENT DOCUMENTS
JP    5-090556    4/1993

(Continued)

OTHER PUBLICATIONS

S. Inoue et al., "A 3.25M-pixel APS-C size CMOS Image Sensor," 2001 IEEE Workshop on Charge-Coupled Devices and Advanced Image Sensors, Jun. 7-9, 2001, pp. 16-19.

(Continued)

*Primary Examiner*—Sinh Tran
*Assistant Examiner*—Anthony J Daniels
(74) *Attorney, Agent, or Firm*—Foley & Lardner LLP

(57) ABSTRACT

A solid-state imaging device and an optical sensor, which can enhance a wide dynamic range while keeping a high sensitivity with a high S/N ratio, and a method of operating a solid-state imaging device for enhancing a wide dynamic range while keeping a high sensitivity with a high S/N ratio are disclosed. An array of integrated pixels has a structure wherein each pixel comprises a photodiode PD for receiving light and generating and accumulating photoelectric charges and a storage capacitor element $C_S$ coupled to the photodiode PD through a transfer transistor Tr1 for accumulating the photoelectric charges overflowing from the photodiode PD. The storage capacitor element $C_S$ is structured to accumulate the photoelectric charges overflowing from the photodiode PD in a storage-capacitor-element accumulation period $T_{CS}$ that is set to be a period at a predetermined ratio with respect to an accumulation period of the photodiode PD.

2 Claims, 28 Drawing Sheets

U.S. PATENT DOCUMENTS

| | | | |
|---|---|---|---|
| 6,780,666 B1 * | 8/2004 | McClure | 438/57 |
| 6,888,122 B2 * | 5/2005 | Fossum | 250/208.1 |
| 2002/0000508 A1 | 1/2002 | Muramatsu et al. | |
| 2003/0020100 A1 | 1/2003 | Guidash | |
| 2004/0051801 A1 | 3/2004 | Iizuka et al. | |
| 2004/0239791 A1 | 12/2004 | Mabuchi | |

FOREIGN PATENT DOCUMENTS

| | | |
|---|---|---|
| JP | 2000-165754 A | 6/2000 |
| JP | 2000-165754 A | 6/2000 |
| JP | 2001-186414 A | 7/2001 |
| JP | 2002-077737 A | 3/2002 |
| JP | 2003-018471 A | 1/2003 |
| JP | 2003-134396 A | 5/2003 |
| JP | 2004-111590 A | 4/2004 |

OTHER PUBLICATIONS

T. Kakumoto et al., "Logarithmic Conversion CMOS Image Sensor with FPN Cancellation and Integration Circuits," Journal of Image Information Media, vol. 57:8 (2003), pp. 1013-1018.

Y. Muramatsu et al., "A Signal-Processing CMOS Image Sensor Using a Simple Analog Operation," IEEE Journal of Solid-State Circuits, vol. 38:Jan. 1, 2003, pp. 101-106.

* cited by examiner

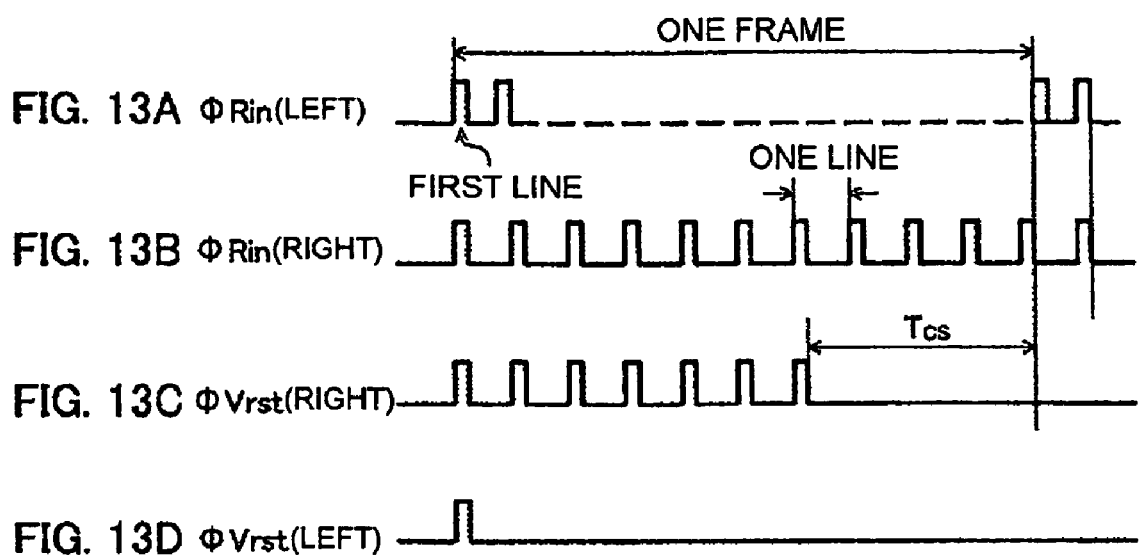

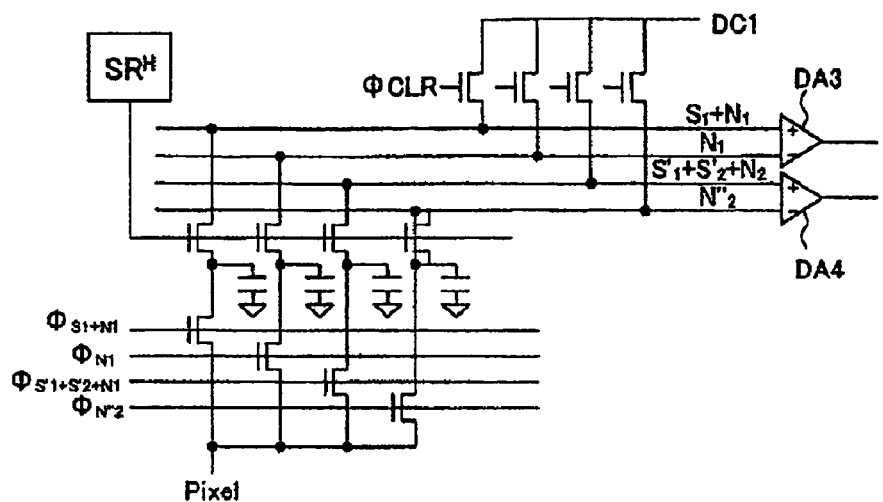
FIG. 21A
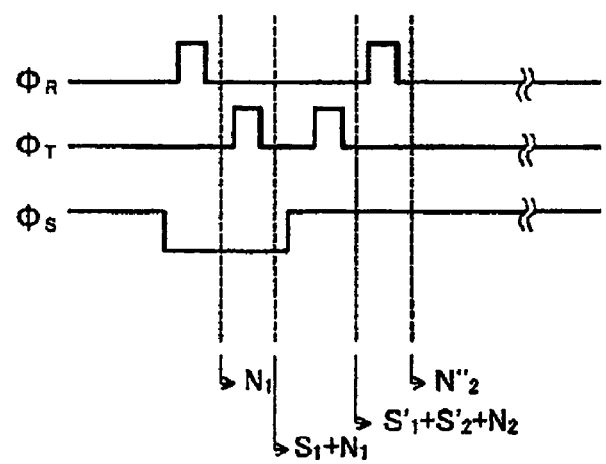
FIG. 21B
FIG. 22
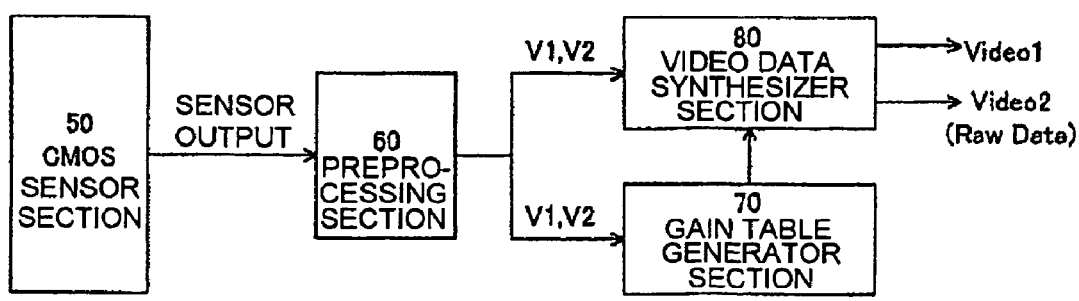

US 7,800,673 B2

SOLID-STATE IMAGING DEVICE, OPTICAL SENSOR AND METHOD OF OPERATING SOLID-STATE IMAGING DEVICE

TECHNICAL FIELD

The present invention relates to solid-state imaging devices, optical sensors and methods of operating the solid-state imaging devices and, more particularly, to a solid-state imaging device and an optical sensor of a CMOS type and a method of operating such solid-state imaging device.

BACKGROUND ART

Image sensors for an image-input use such as CMOS (Complementary Metal-Oxide-Semiconductor) image sensors or CCD (Charge Coupled Device) image sensors have achieved improvements in performances with an expanding demand for applications in, for instance, digital cameras and cellular phones each equipped with a camera.

The image sensors, described above, need to be further improved in performances, one of which relates to widening a dynamic range.

The conventional image sensor has a dynamic range limited in the order of, for instance, approximately 3 to 4 digits (60 to 80 dB) and does not cover a value of 5 to 6 digits (100 to 120 dB) of the naked eye or a silver-halide film.

Therefore, work has heretofore been expected on research and development of a high-quality image sensor with a dynamic range in the order of 5 to 6 digits (100 to 120 dB) in level equivalent to those of the naked eye or the silver-halide film. The image sensor with such a wide dynamic range has been expected to have applications, in addition to a digital camera or a cellular phone equipped with the digital camera or the like, an image-input camera for a PDA (Personal Digital Assistant), a camera for an advanced traffic management system, a monitoring camera, a camera for an FA (Factory Automation) or a camera for medical use.

As technology of improving characteristics of the image sensor set forth above, for instance, Non-Patent Document 1 discloses that a so-called on-chip noise canceling technology has been developed. In this technology, in order to enhance high sensitivity and a high S/N ratio, the operations are executed to read out noise occurring in a photodiode of each pixel and a signal resulting from relevant noise added with a light signal to take a difference between those components and noise components are removed to allow only a light signal to be extracted.

However, even with such a method, the dynamic range lies at a value less than 80 dB and, therefore, a further widened dynamic range has heretofore been expected.

For example, Patent Document 1 discloses technology in which as shown in FIG. 1, a floating diffusion region having a small capacitance $C_1$ for high sensitivity in low illuminance and a floating diffusion region having a large capacitance $C_2$ for low sensitivity in high illuminance are connected to a photodiode PD to output an output "out 1" for low illuminance and output "out 2" for high illuminance.

Further, Patent Document 2 discloses technology in which as shown in FIG. 2, a capacitance $C_S$ of a floating diffusion region FD is arranged to be variable in a range to cover sensitivities for low illuminance and high illuminance for thereby providing a wide dynamic range.

In addition, double-shooting technology has been developed for the shootings in different exposure times for picking up an image in high illuminance with a short exposure time and picking up an image in low illuminance with a long exposure time.

Moreover, Patent Document 3 and Non-Patent Document 2 disclose technologies of widening dynamic range by connecting a transistor switch T between a photodiode PD and a capacitor C, as shown in FIG. 36, and turning on the switch T for a first exposure time allows photoelectric charges to be accumulated in both the photodiode PD and the capacitor C while turning off the switch T for a second exposure time allows, in addition to preceding accumulation of the charges, photoelectric charges to be accumulated. Here, clear demonstration has been made that if light is incident at a rate higher than that causing saturation, an excess of charges is discharged via a reset transistor.

Further, Patent Document 4 discloses that as shown in FIG. 37, a photodiode PD adopts a capacitor C having a larger capacitance than that of the related art capacitance to comply with the shooting in high illuminance.

Furthermore, Non-Patent Document 3 discloses technology in which as shown in FIG. 38, a logarithmic conversion circuit includes MOS transistors in combination for generating an output upon executing logarithmic conversion of a signal delivered from a photodiode PD to comply with the shooting in high illuminance.

However, according to the methods disclosed in the Patent Documents 1, 2, 3 and the Non-Patent Document 2, mentioned above, or the method of performing the double shooting for different exposure times, the shootings for low illuminance and high illuminance need to be performed at different times. Therefore, a difference exists in moving images resulting from the shootings performed in respective illuminance and an issue occurs with a difficulty caused in matching both of the images.

Further, with the methods disclosed in Patent-Document 4 and Non-Patent Document 3 mentioned above, even though a scheme of complying with the shooting in high illuminance can achieve a wide dynamic range, the shooting in low illuminance results in a consequence of low sensitivity with a degraded S/N ratio and the image cannot have improved quality.

As mentioned above, the image sensors such as the CMOS sensors or the like is difficult to achieve a wide dynamic range while keeping high sensitivity with a high S/N ratio.

Moreover, the above is not limited to the image sensor. In the line sensor, including linearly arranged pixels and the optical sensor with no plural pixels, it is difficult achieve a wide dynamic range while keeping high sensitivity with a high S/N ratio.

Patent Document 1: Japanese Unexamined Patent Application Publication (JP-A) No. 2003-134396

Patent Document 2: Japanese Unexamined Patent Application Publication (JP-A) No. 2000-165754

Patent Document 3: Japanese Unexamined Patent Application Publication (JP-A) No. 2002-77737

Patent Document 4: Japanese Unexamined Patent Application Publication (JP-A) No. H5-90556 Non-Patent Document 1: S. Inoue et al., IEEE. Workshop on CCDs and Advanced Image Sensors 2001, page 16-19

Non-Patent Document 2: Yoshinori Muramatsu et al., IEEE Journal of Solid-state Circuits, vol. No. 1, January 2003

Non-Patent Document 3: Journal of Image Information Media, 57 (2003)

DISCLOSURE OF THE INVENTION

Problems to be Solved by the Invention

The present invention has been completed in view of the above statuses and has an object to provide a solid-state imaging device and an optical sensor, which can enhance a wide dynamic range while keeping high sensitivity with a high S/N ratio, and a method of operating a solid-state imaging device that can enhance a wide dynamic range while keeping high sensitivity with a high S/N ratio.

In order to achieve the aforementioned object, according to the present invention, there is provided a solid-state imaging device having an integrated array of a plurality of pixels, each pixel comprising:

a photodiode for receiving light and generating and accumulating photoelectric charges;

a transfer transistor for transferring the photoelectric charges; and a storage capacitor element coupled to the photodiode at least through the transfer transistor for accumulating, at least through the transfer transistor, the photoelectric charges overflowing from the photodiode in a storage-capacitor-element accumulation period that is set to be a period at a predetermined ratio with respect to an accumulation period of the photodiode.

According to the solid-state imaging device of the present invention, the integrated array of pixels is formed in a structure wherein the photodiode for receiving light and generating and accumulating photoelectric charges, and the storage capacitor element, accumulating photoelectric charges overflowing from the photodiode, are connected through the transfer transistor. Here, the storage capacitor element may accumulate the photoelectric charges overflowing from the photodiode in a storage-capacitor-element accumulation period that is set to be a period at a predetermined ratio with respect to an accumulation period of the photodiode.

Preferably, the solid-state imaging device according to the present invention, further comprises between the transfer transistor and the storage capacitor element;

a floating diffusion region to which the photoelectric charges are transferred via the transfer transistor; and an accumulation transistor operative to couple or split potentials of the floating diffusion region and the storage capacitor element.

According to the present invention, there is provided a solid-state imaging device having an integrated array of a plurality of pixels, each pixel comprising:

a photodiode for receiving light and generating and accumulating photoelectric charges;

a transfer transistor for transferring the photoelectric charges;

a floating diffusion region to which the photoelectric charges are transferred via the transfer transistor;

a storage capacitor element coupled to the floating diffusion region in a way to enable coupling or splitting of a potential and for accumulating the photoelectric charges overflowing from the photodiode through the transfer transistor and the floating diffusion region in an accumulation period of the photodiode; and an accumulation transistor for coupling or splitting potentials of the floating diffusion region and the storage capacitor element;

wherein under a circumstance where the potential is split between the storage capacitor element and the floating diffusion region, the floating diffusion region accumulates the photoelectric charges overflowing from the photodiode in a floating diffusion region accumulation period that is set to be a period at a predetermined ratio with respect to an accumulation period of the photodiode.

According to the solid-state imaging device of the present invention, the integrated array of pixels is formed in a structure including the photodiode for receiving light and generating and accumulating photoelectric charges, the floating diffusion region to which the photoelectric charges are transferred via the transfer transistor, and the storage capacitor element coupled to the floating diffusion region in a way to enable coupling or splitting potentials for accumulating photoelectric charges overflowing from the photodiode. Here, the floating diffusion region may accumulate the photoelectric charges overflowing from the photodiode in a floating diffusion region accumulation period that is set to be a period at a predetermined ratio with respect to the accumulation period of the photodiode.

According to the present invention, there is provided the solid-state imaging device, wherein the storage capacitor element accumulates the photoelectric charges overflowing from the photodiode in a storage-capacitor-element accumulation period that is set to be a period at a predetermined ratio with respect to the accumulation period of the photodiode.

Preferably, the solid-state imaging device according to the present invention, further comprises:

a reset transistor coupled to the floating diffusion region for discharging the photoelectric charges of the floating diffusion region;

an amplifying transistor amplifying the photoelectric charges in the floating diffusion region for conversion to a voltage signal; and a selection transistor coupled to the amplifying transistor for selecting the pixel.

More preferably, the solid-state imaging device further comprises:

noise cancel means taking a differential component between a voltage signal, resulting from the photoelectric charges transferred to the floating diffusion region, and a voltage signal at a reset level of the floating diffusion region and taking a differential component between a voltage signal, resulting from the photoelectric charges transferred to the floating diffusion region and the storage capacitor element, and a voltage signal at a reset level of the floating diffusion region and the storage capacitor element.

More preferably, the solid-state imaging device, further comprises:

storage means for storing a voltage signal of the floating diffusion region and the storage capacitor element at a reset level.

More preferably, the solid-state imaging device, further comprises:

noise cancel means taking a differential component between a voltage signal, resulting from the photoelectric charges transferred to the floating diffusion region, and a voltage signal at a reset level of the floating diffusion region, and taking a differential component between a voltage signal, resulting from the photoelectric charges transferred to the floating diffusion region and the storage capacitor element, and a voltage signal at a reset level of the floating diffusion region or a differential component between a voltage signal of a current frame, resulting from the photoelectric charges transferred to the floating diffusion region and the storage capacitor element, and a voltage signal at a reset level of a subsequent frame of the floating diffusion region and the storage capacitor element.

Preferably, the solid-state imaging device of the present invention, further comprises:

a reset transistor coupled to a junction between the storage capacitor element and the accumulation transistor for discharging the photoelectric charges from the storage capacitor element and the floating diffusion region;

an amplifying transistor for amplifying the photoelectric charges in the floating diffusion region for conversion to a voltage signal; and a selection transistor coupled to the amplifying transistor for selecting the pixel.

More preferably, the solid-state imaging device, further comprises:

noise cancel means taking a differential component between a voltage signal, resulting from the photoelectric charges transferred to the floating diffusion region, and a voltage signal at the level of the floating diffusion region prior to the transferring.

More preferably, the solid-state imaging device, further comprises:

noise cancel means taking a differential component between a voltage signal, resulting from the photoelectric charges transferred to the floating diffusion region and the storage capacitor element, and a voltage signal at a reset level of the floating diffusion region and the storage capacitor element.

More preferably, the solid-state imaging device, further comprises:

storage means for storing a voltage signal at a reset level of the floating diffusion region and the storage capacitor element.

According to the present invention, there is provided a solid-state imaging device having an integrated array of a plurality of pixels, each pixel comprising:

a photodiode for receiving light and generating and accumulating photoelectric charges;

a transfer transistor for transferring the photoelectric charges;

a floating diffusion region to which the photoelectric charges are transferred via the transfer transistor;

a storage capacitor element coupled to the floating diffusion region in a way to enable coupling or splitting of a potential and for accumulating the photoelectric charges overflowing from the photodiode through the transfer transistor and the floating diffusion region in an accumulation period of the photodiode; and an accumulation transistor for coupling or splitting potentials of the floating diffusion region and the storage capacitor element;

and further comprising:

noise cancel means taking a differential component between a voltage signal, resulting from the photoelectric charges transferred to the floating diffusion region, and a voltage signal at a reset level of the floating diffusion region, and taking a differential component between a voltage signal, resulting from the photoelectric charges transferred to the floating diffusion region and the storage capacitor element, and a voltage signal at a reset level of the floating diffusion region or a differential component between a voltage signal of a current frame, resulting from the photoelectric charges transferred to the floating diffusion region and the storage capacitor element, and a voltage signal at a reset level of a subsequent frame of the floating diffusion region and the storage capacitor element.

The solid-state imaging device of the present invention may comprise noise cancel means that takes a differential component between a voltage signal, resulting from the photoelectric charges transferred to the floating diffusion region, and a voltage signal at a reset level of the floating diffusion region, and a differential component between a voltage signal, resulting from the photoelectric charges transferred to the floating diffusion region and the storage capacitor element, and a voltage signal at a reset level of the floating diffusion region or a differential component between a voltage signal of a current frame, resulting from the photoelectric charges transferred to the floating diffusion region and the storage capacitor element, and a voltage signal at a reset level of a subsequent frame of the floating diffusion region and the storage capacitor element.

Preferably, there is provided the solid-state imaging device of the present invention, wherein the noise cancel means comprises an alternating current coupling circuit that outputs the differential component between the voltage signal, resulting from the photoelectric charges transferred to the floating diffusion region, and the voltage signal at the reset level of the floating diffusion region, the differential component between the voltage signal, resulting from the photoelectric charges transferred to the floating diffusion region and the storage capacitor element, and the voltage signal at the reset level of the floating diffusion region or the differential component between the voltage signal of the current frame, resulting from the photoelectric charges transferred to the floating diffusion region and the storage capacitor element, and the voltage signal at the reset level of the subsequent frame of the floating diffusion region and the storage capacitor element, as alternating current components, respectively.

More preferably, there is provided the solid-state imaging device, wherein the noise cancel means comprises a differential amplifier of a two-capacitor type that outputs the differential component between the voltage signal, resulting from the photoelectric charges transferred to the floating diffusion region, and the voltage signal at the reset level of the floating diffusion region, the differential component between the voltage signal, resulting from the photoelectric charges transferred to the floating diffusion region and the storage capacitor element, and the voltage signal at the reset level of the floating diffusion region or the differential component between the voltage signal of the current frame, resulting from the photoelectric charges transferred to the floating diffusion region and the storage capacitor element, and the voltage signal at the reset level of the subsequent frame of the floating diffusion region and the storage capacitor element.

According to the present invention, there is provided a solid-state imaging device comprising:

a sensor section including an integrated array of a plurality of pixels, each pixel including a photodiode for receiving light and generating and accumulating photoelectric charges, a transfer transistor for transferring the photoelectric charges, a floating diffusion region to which the photoelectric charges are transferred via the transfer transistor, a storage capacitor element coupled to the floating diffusion region in a way to enable coupling or splitting of a potential and for accumulating the photoelectric charges overflowing from the photodiode through the transfer transistor and the floating diffusion region in an accumulation period of the photodiode, and an accumulation transistor for coupling or splitting potentials of the floating diffusion region and the storage capacitor element;

a preprocessing section calculating differential components among a voltage signal, resulting from the photoelectric charges transferred to the floating diffusion region, a voltage signal, resulting from the photoelectric charges transferred to the floating diffusion region and the storage capacitor element and voltage signals at reset levels or levels equivalent to the reset levels of the respective voltage signals;

a gain table generating section generating a gain table by which gains for respective pixels are set depending on the differential components; and a video data synthesizing section synthesizing video data in response to the differential components and data of the gain table.

The solid-state imaging device according to the present invention may comprise a sensor section, a preprocessing section, a gain table generating section and a video data synthesizing section. The sensor section may include an integrated array of a plurality of pixels formed in a structure including a photodiode for receiving light and generating and accumulating photoelectric charges, a floating diffusion region to which the photoelectric charges are transferred via the transfer transistor, and a storage capacitor element coupled to the floating diffusion region in a way to enable coupling or splitting of a potential and for accumulating the photoelectric charges overflowing from the photodiode through the transfer transistor and the floating diffusion region. The preprocessing section calculates differential components of a voltage signal, resulting from the photoelectric charges transferred to the floating diffusion region, and a voltage signal, resulting from the photoelectric charges transferred to the floating diffusion region and the storage capacitor element with respect to voltage signals at reset levels or levels equivalent to the reset levels of the respective voltage signals. The gain table generating section generates a gain table by which gains for respective pixels are set depending on the differential components. The video data synthesizing section synthesizes video data in response to the differential components and data of the gain table.

Preferably, there is provided the solid-state imaging device of the present invention, wherein the preprocessing section calculates, as the differential components, a first differential component between the voltage signal, resulting from the photoelectric charges transferred to the floating diffusion region, and the voltage signal at the reset level of the floating diffusion region, and a second differential component between the voltage signal, resulting from the photoelectric charges transferred to the floating diffusion region and the storage capacitor element, and the voltage signal at the reset level of the floating diffusion region and the storage capacitor element or the voltage signal at the reset level of the floating diffusion region.

More preferably, the gain table generating section calculates a ratio between the first and second differential components as gain table data for each pixel when the first differential component has a value falling in a given range and generating gain table data.

More preferably, the video data synthesizing section obtains and outputs video data depending on a sum of the first or second differential components and a given threshold value based on a preset video table.

More preferably, the video data synthesizing section outputs a product between the first or second differential components and the gain table data.

Further, in order to achieve the above object, the present invention provides an optical sensor having one pixel of the solid-state imaging device of the present invention.

Further, in order to achieve the aforementioned object, according to the present invention, there is provided a method of operating a solid-state imaging device having an integrated array of a plurality of pixels, each pixel having a photodiode for receiving light and generating and accumulating photoelectric charges, a transfer transistor and an accumulation transistor for transferring the photoelectric charges, a floating diffusion region coupled to the photodiode via the transfer transistor, and a storage capacitor element accumulating photoelectric charges, overflowing from the photodiode, via the transfer transistor and the accumulation transistor in an accumulating period of the photodiode to allow the accumulation transistor to control coupling or splitting of a potential with respect to the floating diffusion region, the operating method comprising:

turning off the transfer transistor prior to accumulating a charge and turning on the accumulation transistor for discharging the photoelectric charges from the floating diffusion region and the storage capacitor element;

reading out a voltage signal at a reset level of the floating diffusion region and the storage capacitor element;

accumulating pre-saturated charges, among the photoelectric charges occurring in the photodiode, in the photodiode and accumulating supersaturated charges, overflowing from the photodiode, in the floating diffusion region and the storage capacitor element in a storage-capacitor-element accumulation period that is set to be a period at a predetermined ratio with respect to the accumulation period of the photodiode;

turning off the accumulation transistor to split potentials of the floating diffusion region and the storage capacitor element and discharging the photoelectric charges from the floating diffusion region;

reading out a voltage signal at a reset level of the floating diffusion region;

turning on the transfer transistor to transfer the pre-saturated charges to the floating diffusion region and reading out a voltage signal including the pre-saturated charges; and turning off the accumulation transistor to couple the potentials of the floating diffusion region and the storage capacitor element and reading out a voltage signal including the pre-saturated charges and the supersaturated signal.

According to the method of operating the solid-state imaging device of the present invention, the transfer transistor is turned off prior to accumulating the charge and the accumulation transistor is turned on for discharging the photoelectric charges from the floating diffusion region and the storage capacitor element, upon which the voltage signal at a reset level of the floating diffusion region and the storage capacitor element is read out.

Then, among the photoelectric charges occurring in the photodiode, the pre-saturated charges are accumulated in the photodiode. Further, the supersaturated charges, overflowing from the photodiode, are accumulated in the floating diffusion region and the storage capacitor element in the storage-capacitor-element accumulation period that is set be to the period at a predetermined ratio with respect to the accumulation period of the photodiode.

Subsequently, the accumulation transistor is turned off to split potentials of the floating diffusion region and the storage capacitor element for discharging the photoelectric charges from the floating diffusion region to read out the voltage signal at the reset level of the floating diffusion region.

Thereafter, the transfer transistor is turned on to transfer the pre-saturated charge to the floating diffusion region for reading out the voltage signal including the pre-saturated charge.

Then, the accumulation transistor is turned on to couple the potentials of the floating diffusion region and the storage capacitor element for reading out the voltage signal including the pre-saturated charge and the supersaturated signal.

Further, in order to achieve the aforementioned object, according to the present invention, there is provided a method of operating a solid-state imaging device having an integrated array of a plurality of pixels, each pixel having a photodiode for receiving light and generating and accumulating photoelectric charges, a transfer transistor and an accumulation transistor for transferring the photoelectric charges, a floating diffusion region coupled to the photodiode via the transfer transistor, and a storage capacitor element accumulating photoelectric charges, overflowing from the photodiode, via the transfer transistor and the accumulation transistor in an accumulating period of the photodiode to allow the accumulation transistor to control coupling or splitting a potential with respect the floating diffusion region, the operating method comprising:

turning off the transfer transistor prior to accumulating a charge and turning on the accumulation transistor for discharging the photoelectric charges from the floating diffusion region and the storage capacitor element;

reading out a voltage signal at a reset level of the floating diffusion region and the storage capacitor element;

accumulating pre-saturated charges, among the photoelectric charges occurring in the photodiode, in the photodiode and accumulating supersaturated charges, overflowing from the photodiode, in the floating diffusion region and the storage capacitor element;

turning off the accumulation transistor to split potentials of the floating diffusion region and the storage capacitor element and discharging the photoelectric charges from the floating diffusion region;

reading out a voltage signal at a reset level of the floating diffusion region;

permitting the floating diffusion region, under a status where the potential is split between the storage capacitor element and the floating diffusion region, to accumulate ultra-supersaturated charges overflowing from the photodiode in a floating diffusion region accumulation period that is set to be a period at a predetermined ratio with respect to an accumulation period of the photodiode;

reading out a voltage signal including the ultra-supersaturated charges;

turning on the transfer transistor to transfer the pre-saturated charges to the floating diffusion region and reading out a voltage signal including the pre-saturated charges; and turning off the accumulation transistor to couple the potentials of the floating diffusion region and the storage capacitor element and reading out a voltage signal including the pre-saturated charges and the supersaturated signal.

According to the method of operating the solid-state imaging device of the present invention, the transfer transistor is turned off prior to accumulating the charge and turning on the accumulation transistor for discharging the photoelectric charges from the floating diffusion region and the storage capacitor element to read out the voltage signal at the reset level of the floating diffusion region and the storage capacitor element.

Subsequently, among the photoelectric charges occurring in the photodiode, the pre-saturated charge is accumulated in the photodiode and the supersaturated charge, overflowing from the photodiode, is accumulated in the floating diffusion region and the storage capacitor element.

Then, the accumulation transistor is turned off to split potentials of the floating diffusion region and the storage capacitor element for discharging the photoelectric charges from the floating diffusion region to read out the voltage signal at the reset level of the floating diffusion region.

Next, under a status where the potential is split between the storage capacitor element and the floating diffusion region, the floating diffusion region accumulates the ultra-supersaturated charges overflowing from the photodiode in the floating diffusion region accumulation period that is set to be a period at a predetermined ratio with respect to the accumulation period of the photodiode for reading out the voltage signal including ultra-supersaturated charges.

Thereafter, the transfer transistor is turned on to transfer the pre-saturated charges to the floating diffusion region for reading out the voltage signal including the pre-saturated charges.

Then, the accumulation transistor is turned on to couple the potentials of the floating diffusion region and the storage capacitor element for reading out the voltage signal including the pre-saturated charges and the supersaturated signal.

EFFECT OF THE INVENTION

With the solid-state imaging device according to the present invention, the photodiode generates the photoelectric charges upon receipt of light and accumulates the same and keeps high sensitivity in low illuminance with a high S/N ratio. Additionally, the storage capacitor element accumulates the photoelectric charges overflowing from the photodiode for thereby enabling the shooting in high illuminance in a wide dynamic range.

With the optical sensor according to the present invention, a wide dynamic range can be enhanced while keeping high sensitivity with a high S/N ratio.

With the method of operating the solid-state imaging device according to the present invention, a wide dynamic range can be enhanced while keeping high sensitivity with a high S/N ratio.

BRIEF DESCRIPTION OF THE DRAWINGS

FIGS. 13A and 13B show waveforms of $\Phi R_{in}$ input to a circuitry including an S/H-line shift register $SR^V_{SH}$ (on left) and a resetting line shift register $SR^V_{RST}$ (on right) shown in FIGS. 12A and 12B, and FIGS. 13C and 13D show initial signals input to the S/H-line shift register $SR^V_{SH}$ (on left) and the resetting line shift register $SR^V_{RST}$ (on right).

FIG. 21A is a circuit diagram of a CDS circuit of the CMOS image sensor of the third embodiment according to the present invention and FIG. 21B is a timing chart showing voltages, applied to drivelines, and sampling timings.

FIG. 22 is a block diagram for processing signals in a CMOS image sensor of a fourth embodiment according to the present invention.

REFERENCE NUMERALS

10 . . . n-type semiconductor substrate, 11 . . . p-type well, 12, 14, 17 . . . p'-type separating regions, 13 . . . n-type semiconductor region, 15, 16 . . . n'-type semiconductor regions, 20, 21, 22 . . . element separating insulation films, 23, 24 . . . gate insulation films, 25 . . . capacitor insulation film, 30, 31 . . . gate electrodes, 32 . . . upper electrode, 33, 34 . . . wire leads, 50 . . . CMOS image sensor section, 60 . . . preprocessing section, 61, 63 . . . differential amplifiers, 62 . . . subtraction block, 70 . . . gain table generating section, 71 . . . upper limit setting section, 72 . . . lower limit setting section, 73 . . . comparator, 74 . . . dividing block, 75 . . . gain table, 76 . . . indicator, 80 . . . video data synthesizing section, 81 . . . limitter, 82 . . . comparator, 83 . . . threshold value setting section, 84, 85 . . . selectors, 86 . . . adding block, 87 . . . video table, 88 . . . multiplying block, ADC1-6 . . . AD converters, AP . . . amplifier, $C_1$ . . . small capacitance, $C_2$ . . . large capacitance, $C_{FD}$, $C_{PD}$, C . . . capacitances, $C_S$ . . . storage capacitor element, CDS . . . CDS circuit, CH . . . chip, CP, $CP_1$, $CP_2$ . . . comparators, $CT_a$, $CT_b$ . . . circuits, DA1-4 . . . differential amplifiers, FD . . . floating diffusion region, FM . . . frame memory, GND . . . ground, LT . . . light, $N_1$ . . . signal (noise) at a reset level of $C_{FD}$, $N_2$ . . . signal (noise) at a reset level of $C_{FD}$+$C_S$, out . . . output (line), out1, out2 . . . outputs, PD . . . photodiode, Pixel . . . pixel, $Q_A$ . . . supersaturated charges, $Q_B$ . . . pre-saturated charges, R . . . reset transistor, $S_1$ . . . pre-saturated charge signal, $S_1'$ . . . modulated pre-saturated charge signal, $S_2$ . . . supersaturated electric signal, $S_2'$ . . . modulated supersaturated charge signal, $S_3$ . . . ultra-supersaturated charge signal, SE, $SE_1$, $SE_2$ . . . selectors, SL . . . selection line, $SR^H$ . . . row shift register, $SR^V_{SH}$ . . . S/H line shift register, $SR^V_{RST}$ . . . resetting line shift register, $T_{CS}$ . . . transistor switch, $T_0$-$T_4$ . . . times, $T_{PD}$ . . . accumulation period of photodiode, $T_{CS}$ . . . storage-capacitor-element accumulation period, $T_{FD}$ . . . floating diffusion region accumulation period, Tr1 . . . transfer transistor, Tr2 . . . accumulation transistor, Tr3 . . . reset transistor, Tr4 . . . amplifying transistor, Tr5 . . . selection transistor, VDD . . . power supply voltage, $\Phi_T$, $\Phi_S$, $\Phi_R$, $\Phi_X$, $\Phi_{S1+N1}$, $\Phi_{N1}$, $\Phi_{S1'+N1'+N2}$, $\Phi_{N2}$, $\Phi_{V1}$, $\Phi_{V2}$ . . . drivelines

BEST MODE FOR CARRYING OUT THE INVENTION

Hereunder, embodiments of solid-state imaging devices according to the present invention are described with reference to the accompanying drawings.

First Embodiment

Figure 1:
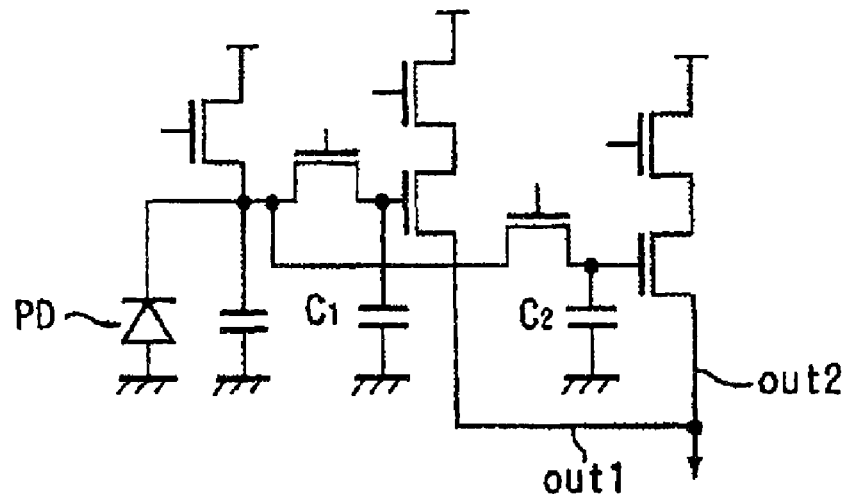
FIG. 1 is an equivalent circuit diagram of one pixel of a CMOS image sensor of a first related art.
Figure 2:
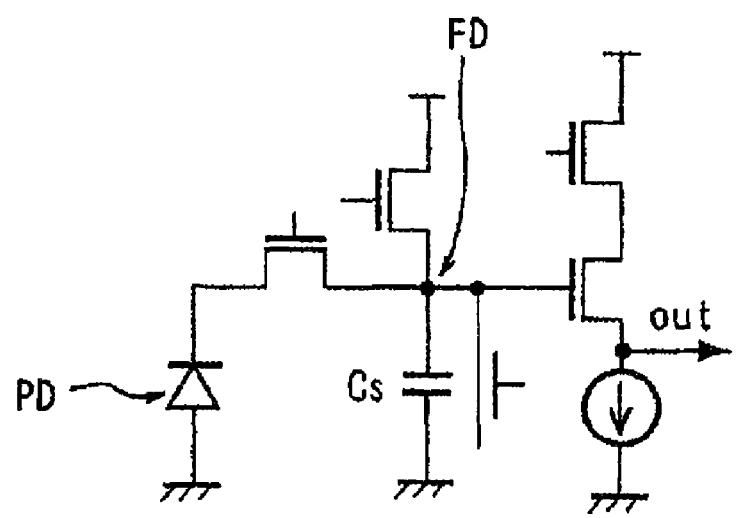
FIG. 2 is an equivalent circuit diagram of one pixel of a CMOS image sensor of a second related art.
Figure 3:
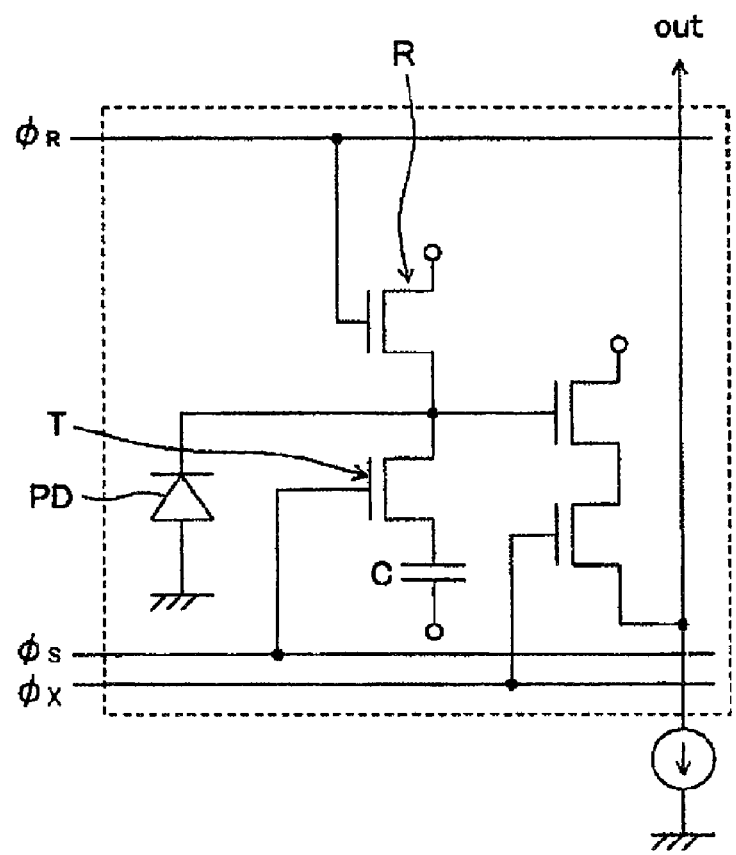
FIG. 3 is an equivalent circuit diagram of one pixel of a CMOS image sensor of a third related art.
Figure 4:
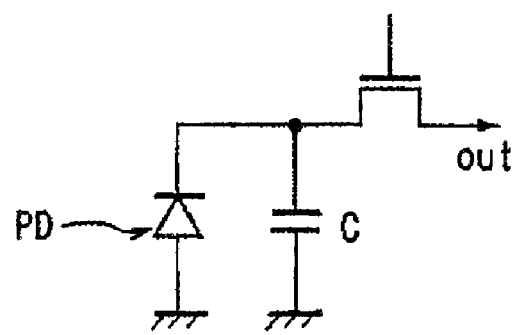
FIG. 4 is an equivalent circuit diagram of one pixel of a CMOS image sensor of a fourth related art.
Figure 5:
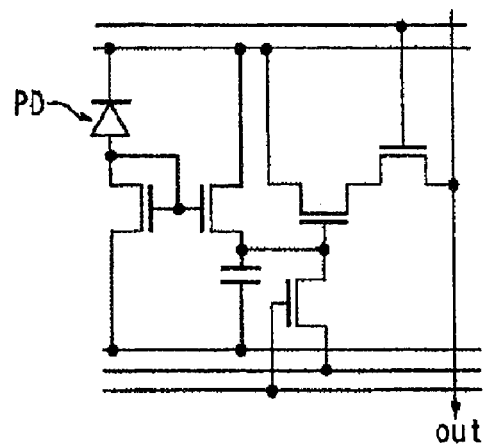
FIG. 5 is an equivalent circuit diagram of one pixel of a CMOS image sensor of a fifth related art.
Figure 6:
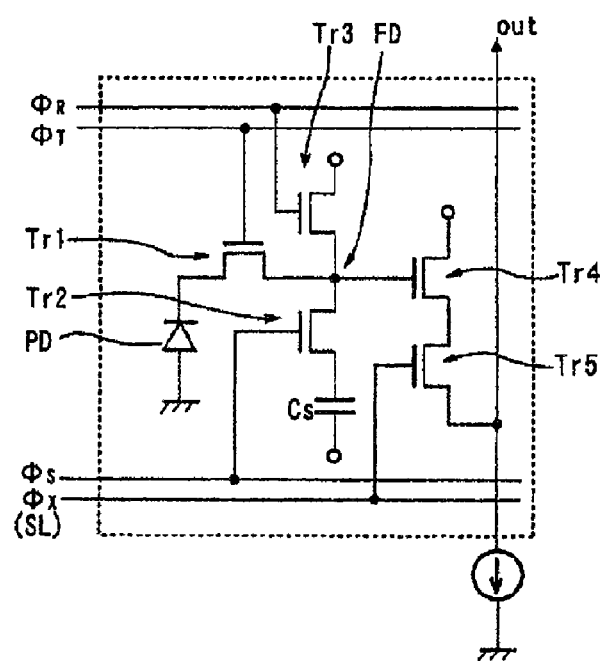
FIG. 6 is an equivalent circuit diagram of one pixel of a CMOS image sensor of a first embodiment according to the present invention.

A solid-state imaging device of the present embodiment is structured in the form of a CMOS image sensor and FIG. 6 is an equivalent circuit diagram for one pixel.

Each pixel includes a photodiode PD for receiving light and generating photoelectric charges, a transfer transistor Tr1 for transferring the photoelectric charges of the photodiode PD, a floating diffusion region FD from which the photoelectric charges are transferred via the transfer transistor Tr1, a storage capacitor element $C_s$ for accumulating the photoelectric charges overflowing from the photodiode during accumulating operation, a storage transistor Tr2 for coupling or splitting potentials of the floating diffusion region FD and the storage capacitor element $C_s$, a reset transistor Tr3 coupled to the floating diffusion region FD for discharging the photoelectric charges of the floating diffusion region FD, an amplifier transistor Tr4 for amplifying the photoelectric charges of the floating diffusion region FD and converting to a voltage signal, and a selection transistor Tr5 coupled to the amplifier transistor for selecting a pixel. Thus, a CMOS image sensor of a so-called five-transistor type is formed in a structure. For instance, any of the five transistors mentioned above includes an N-channel MOS transistor. The reset transistor Tr3 has a drain to which a given reference voltage such as, for instance, a power supply voltage Vdd is supplied. Further, the amplifying transistor Tr4 has a drain to which for instance, the power supply voltage Vdd is supplied. The other terminal of the storage capacitor element $C_S$ is supplied with the power supply voltage Vdd or a reference voltage potential Vss.

The CMOS image sensor of the present embodiment includes an integrated array of a plurality of pixels formed in the structure described above. With each pixel, the transfer transistor Tr1, the storage transistor Tr2 and the reset transistor Tr3 have gate electrodes connected to drivelines $\phi_T, \phi_S, \phi_R$, respectively. Also, the selection transistor Tr5 has a gate electrode connected to a pixel selection line $SL(\phi_X)$ adapted to be driven by a line shift register. Further, the selection transistor Tr5 has a source and drain on an output to which an output line "out" is connected and is controlled by a row shift register to provide an output.

Since the selection transistor Tr5 and the driveline $\phi_X$ may be suffice to fix a voltage of the floating region FD to an appropriate value so as to enable the operations to select or not to select a pixel, these components may be possibly omitted.

Figure 7A:
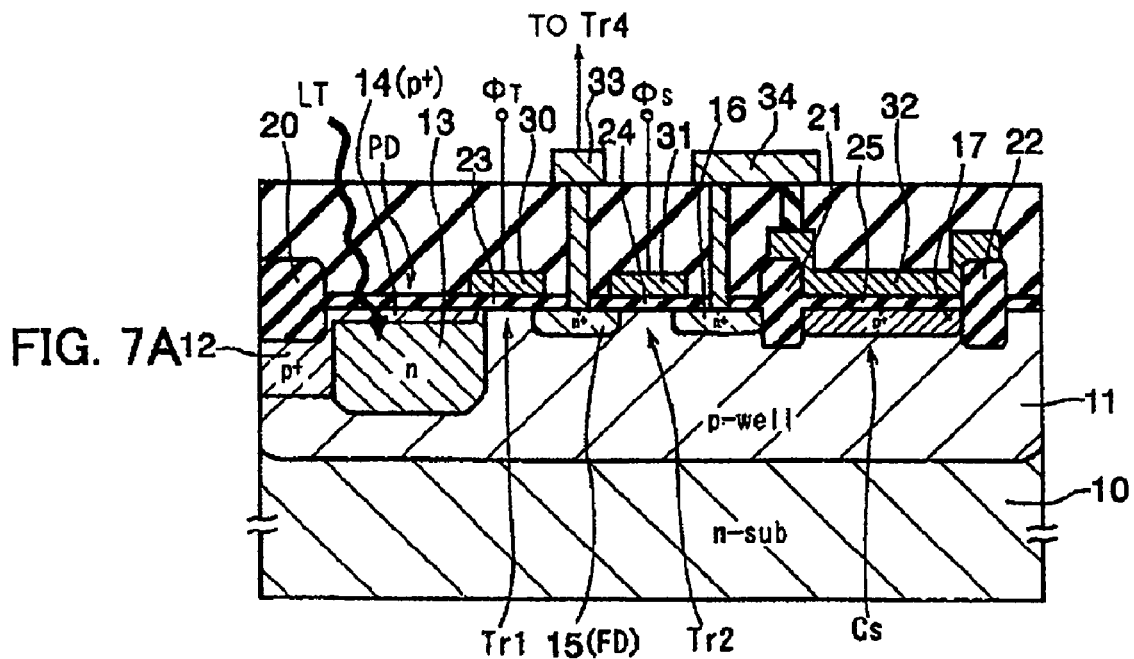
FIG. 7A is a typical cross-sectional view corresponding to a partial area of each pixel of the CMOS image sensor of the first embodiment according to the present invention and FIG. 7B is a typical potential diagram corresponding to regions shown in FIG. 7A.

FIG. 7A is a typical cross-sectional view showing a structure corresponding to a part (the photodiode PD, the transfer transistor Tr1, the floating diffusion region FD, the storage transistor Tr2 and the storage capacitor element $C_S$) of each pixel of the CMOS image sensor of the present embodiment.

For instance, an n-type silicon semiconductor substrate (n-sub) 10 is formed with a p-type well (p-well) 11 on which element separating insulation films (20, 21, 22) are formed by a LOCOS process or the like for separating each pixel and the storage capacity element $C_s$. Further, a p'-type separating region 12 is formed in the p-type well 11 corresponding to an area below the element separating insulation film 20 for separating the pixels from each other.

The p-type well 11 is formed with an n-type semiconductor region 13 whose surface layer is formed with a p'-type semiconductor region 14 in a p-n junction by which a photodiode PD of a charge-transfer buried type is formed. Applying appropriate bias to the p-n junction creates a depleted layer that receives incident light LT and generates photoelectric charges due to a photoelectric effect.

The n-type semiconductor region 13 has a terminal end portion formed in a region sticking out of the p'-type semiconductor region 14. An n'-type semiconductor region 15 is formed on the surface layer of the p-type well 11 in an area remote from the stick-out region by a given distance and serves as the floating diffusion region FD. In addition, an n'-type semiconductor region 16 is formed on the surface layer of the p-type well 11 in another area remote from the stick-out region by a given distance.

Here, a gate electrode 30, made of polysilicon, is formed over an upper surface of the p-type well 11 in an area associated with the n-type semiconductor region 13 and the n'-type semiconductor region 15 via a gate insulation film 23 formed of oxide silicon. Thus, the transfer transistor Tr1 has a source and drain and includes the n-type semiconductor region 13, the n'-type semiconductor region 15 and a channel forming region on the surface layer of the p-type well 11.

Further, a gate electrode 31, made of polysilicon, is formed over the upper surface of the p-type well 11 in an area associated with the n'-type semiconductor region 15 and the n'-type semiconductor region 16 via a gate insulation film 24 formed of oxide silicon. Thus, the storage transistor Tr2 has a source and drain and includes the n-type semiconductor region 15, the n'-type semiconductor region 16 and a channel forming region on the surface layer of the p-type well 11.

Furthermore, a p'-type semiconductor region 17 is formed on the surface layer of the p-type well 11 in an area separated by the element separating insulation films (21, 22) to serve as a lower electrode and has an upper layer on which an upper electrode 32, formed of polysilicon or the like, is formed via a capacitor insulation film 25, formed of oxide silicone or the like to thereby form the storage capacitor element $C_s$.

The transfer transistor Tr1, the storage transistor Tr2 and the storage capacitor element $C_s$ are covered with an insulation film that is formed of oxide silicon so as to form opening portions exposed to the n'-type semiconductor regions 15 and 16 and the upper electrode 32 and a wiring 33 is formed and connected to the n'-type semiconductor region 15 while a wiring 34 is formed to connect the n'-type semiconductor region 16 and the upper electrode 32.

Moreover, the driveline $\phi_T$ is connected to the gate electrode 30 of the transfer transistor Tr1 and, also, the driveline $\phi_S$ is connected to the gate electrode 31 of the storage transistor Tr2.

The other component parts, such as the reset transistor Tr3, the amplifier transistor Tr4, the selection transistor Tr5, the various drivelines $\phi_T, \phi_S, \phi_R, \phi_X$ and the output line "out", are formed on the semiconductor substrate 10 shown in FIG. 7A in areas, not shown, so as to obtain the structure in the equivalent circuit diagram shown in FIG. 6 such that, for instance, the wiring 33 is connected to the amplifier transistor Tr4 that is not shown.

Also, while the storage capacitor element $C_S$ is shown as a planar type MOS capacitor in a cross-sectional view of FIG. 7A, the storage capacitor element $C_S$ may include capacitors in various shapes such as, in addition to the above component, a junction type capacitor, a stack type capacitor, a trench type capacitor or a composite configuration with these components. Additionally, using a capacitor insulation film, made of so-called material High-k such as silicone nitride or $Ta_2O_5$, enables the formation of the storage capacitor element $C_S$ with a further increased capacitance.

Figure 7B:
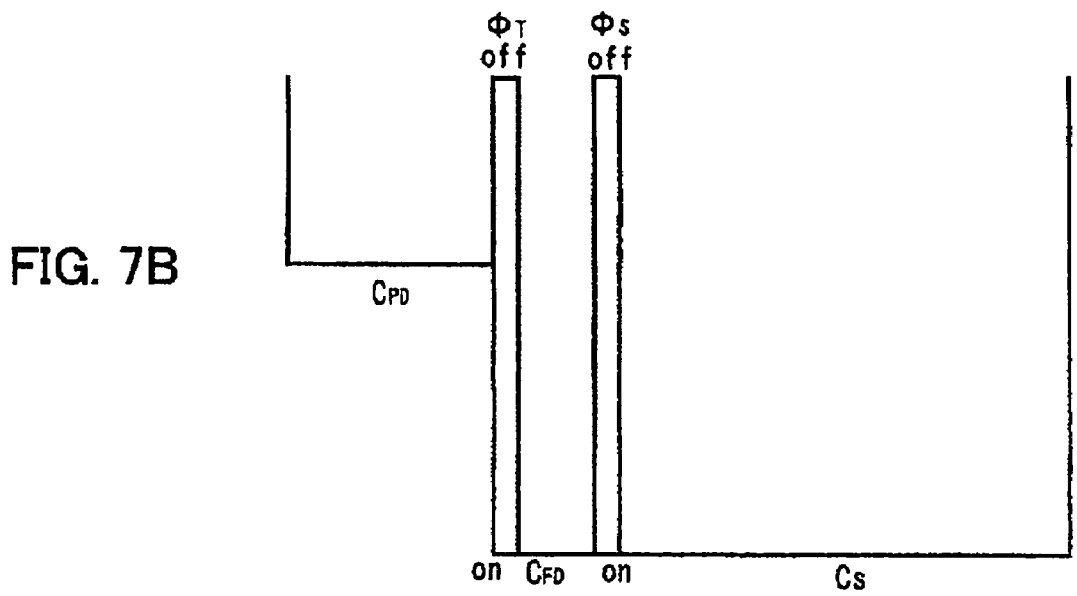

FIG. 7B is a typical potential diagram corresponding to the photodiode PD, the transfer transistor Tr1, the floating diffusion region region FD, the storage transistor Tr2 and the storage capacitor element $C_S$ mentioned above.

The photodiode PD forms a capacitor $C_{PD}$ with a potential that is relatively shallow and the floating diffusion region FD and the storage capacitor $C_S$ form a capacitor ($C_{FD}$, $C_S$) with a potential that is relatively deep.

Here, the transfer transistor Tr1 and the storage transistor Tr2 may take two levels depending on on/off states of the transistors.

A method of driving the CMOS image sensor of the present invention is described below with reference to the illustrated equivalent circuit diagram of FIG. 6, the cross-sectional view of FIG. 7A and the potential diagram of FIG. 7B.

Figure 8:
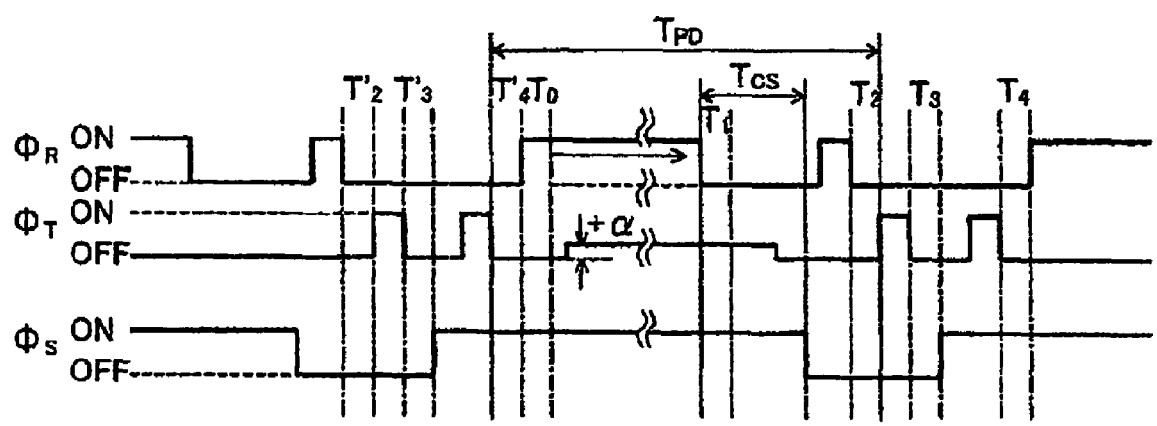
FIG. 8 is a timing chart of voltages applied to drivelines ($\Phi_T$, $\Phi_S$, $\Phi_R$) of the CMOS image sensor of the first embodiment according to the present invention.

FIG. 8 is a timing chart showing voltages applied to the drivelines ($\phi_T$, $\phi_S$, $\phi_R$) in two levels for on/off states with $\phi_T$ having three levels additionally including a level represented by (+α).

The voltage applied to the driveline $\phi_T$ may take the two levels for ON/OFF states and may preferably take the three levels as represented in the present example for enabling the floating diffusion region FD and the storage capacitor element $C_S$ to efficiently capture and accumulate a charge overflowing from the photodiode PD.

Further, FIGS. 9A to 9D and FIGS. 10A to 10D correspond to potential diagrams at respective timings of the timing charts.

Figure 9A:
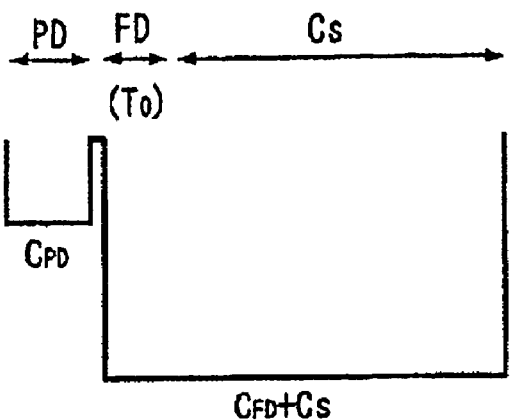
FIGS. 9A to 9D correspond to potential diagrams for respective timings in the timing chart of FIG. 8.

As shown in FIG. 9A, first, at time $T_0$ when a new field starts, $\Phi_T$ is set to be off and $\Phi_S$ is set to be on and under such a status, $\Phi_R$ is set to be on to discharge all the photoelectric charges generated in a preceding field for resetting.

An accumulation time period (substantially equivalent to an imaging period) $T_{PD}$ for $C_{PD}$ begins at a time point ($T_4'$), immediately before time $T_0$, when $\Phi_T$ is set to be off and $C_{PD}$ begins to accumulate the photoelectric charges.

Also, for the reason described above, $\Phi_T$ takes a level (+α) at time instant immediately after time $T_0$.

Next, at time T1 after an elapse of a given time from the beginning of imaging period, $\Phi_T$ is set to be off.

Figure 9B:
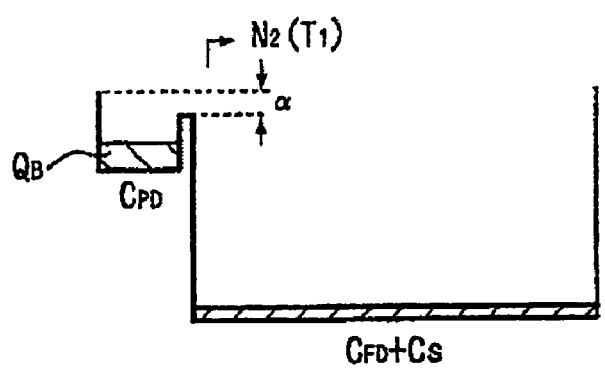

When this takes place, as shown in FIG. 9B, since $\Phi_S$ is set to be on, $C_{PD}$ and $C_S$ are kept in a coupled status and immediately after the resetting, kTC noise resulting form the resetting operation occurs in $C_{PD}+C_S$. Here, the operation is executed to read out a signal at a reset level of $C_{PD}+C_S$ as noise $N_2$.

A method of reading out noise $N_2$ for accumulation in a frame memory (storage means), described below, to allow noise $N_2$ to be utilized in generating an image signal provides an operating method that achieves the highest S/N ratio. However, since noise $N_2$ is sufficiently less than a value of pre-saturated charge (low illumination signal)+supersaturated charge (high illuminance signal) during a supersaturated period, noise $N_1$, described below, may be used in place of noise $N_2$. Further, noise $N_2$ of a subsequent frame may be used in place of noise $N_2$ of the current frame.

At time $T_1$, a storage-capacitor-element accumulation period $T_{CS}$ for $C_S$ begins and photoelectric charges overflowing from the photodiode PD begin to be accumulated in $C_S$.

Also, since a given time has elapsed from the beginning of imaging time as set forth above, the drawing figure represents a status wherein pre-saturated charges $Q_B$ are accumulated in $C_{PD}$.

In such a way, the photoelectric charges are accumulated only in $C_{PD}$ under a situation where the photoelectric charges lie in a value less than that causing the saturation of $C_{PD}$ and the photoelectric charges are accumulated in, in addition to $C_{PD}$, $C_{FD}+C_S$ under a situation where the photoelectric charges lie in a value greater than that causing the saturation of $C_{PD}$.

Figure 9C:
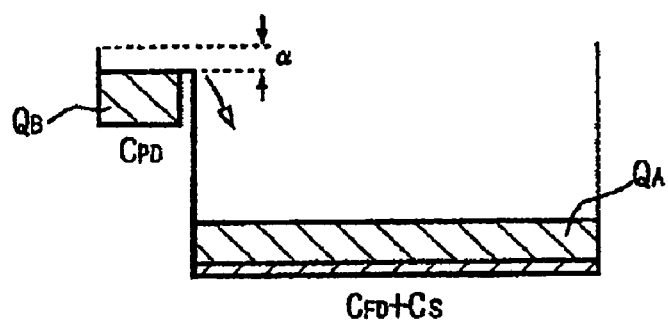

FIG. 9C shows a status wherein the saturation occurs in $C_{PD}$ and the pre-saturated charges $Q_B$ are d in $C_{PD}$ while the supersaturated charges $Q_A$ are accumulated in $C_{FD}$ and $C_S$.

Figure 9D:
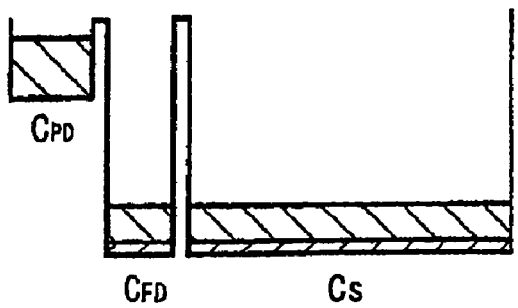

Subsequently, $\Phi_T$ is returned from the level (+α) to be off and $\Phi_S$ is set to be off at the end of the storage-capacitor-element accumulation period $T_{CS}$ for thereby splitting the potential of $C_{PD}$ and $C_S$ as shown in FIG. 9D.

Figure 10A:
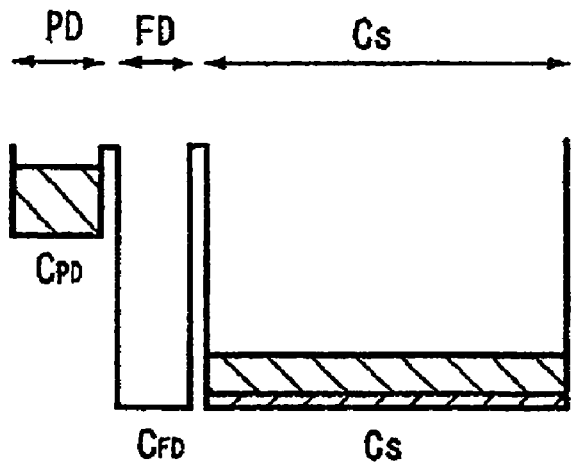
FIGS. 10A to 10D correspond to potential diagrams for respective timings in the timing chart of FIG. 8.

Then, $\Phi_R$ is set to be on to discharge the photoelectric charges from $C_{FD}$ for resetting as shown in FIG. 10A.

Figure 10B:
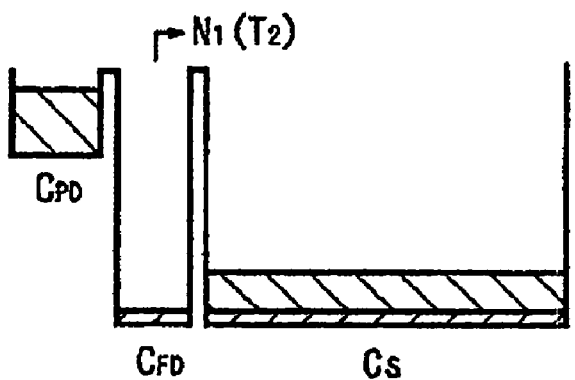

Next, immediately after $\Phi_R$ is set to be off at time $T_2$ and the resetting is completed, kTC noise newly occurs in $C_{FD}$ as shown in FIG. 10B. Here, a signal at a reset level of $C_{FD}$ is read out as noise $N_1$.

Figure 10C:
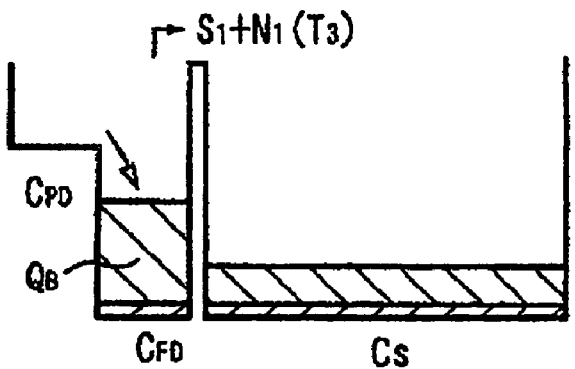

Subsequently, $\Phi_T$ is set to be on to transfer the pre-saturated charges $Q_B$ from $C_{PD}$ to $C_{FD}$ as shown in FIG. 10C. Here, since the potential of $C_{PD}$ is shallower than that of $C_{FD}$ and the level of the transfer transistor is deeper than that of $C_{PD}$, a complete charge transfer can be realized to transfer a whole of the pre-saturated charges $Q_B$ from $C_{PD}$ to $C_{FD}$.

Here, $\Phi_T$ is returned to be off at time $T_3$ and a pre-saturated charge signal $S_1$ is read out from the pre-saturated charges $Q_B$ transferred to $C_{FD}$. However, here, since $C_{FD}$ noise is present, what is actually read out results in $S_1+N_1$. FIG. 10C shows a status appearing before $\Phi_T$ is returned to be off.

Figure 10D:
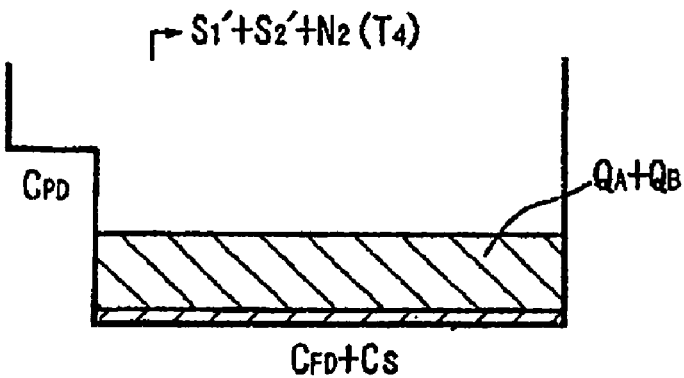

Next, $\Phi_S$ is set to be on and, consecutively, $\Phi_T$ is set to be on to cause the potentials of $C_{PD}$ and $C_S$ to be coupled for mixing the pre-saturated charges $Q_B$ in $C_{FD}$ and the supersaturated charges $Q_A$ in $C_S$ as shown in FIG. 10D.

Here, $\Phi_T$ is returned to be off at time $T_4$ and a signal of a sum of the pre-saturated charge signal $S_1$ and the pre-saturated charges $Q_B$ is read out from the pre-saturated charges $Q_B$+the supersaturated charges $Q_A$ spread in $C_{FD}+C_S$. However, here, since $C_{FD}+C_S$ noise is present and the signal is read out from the charges spread in $C_{FD}+C_S$, what is actually read out includes a value of $S_1'+S_2'+N_2$ (with $S_1'$ and $S_2'$ representing values of $S_1$ and $S_2$ contracted in modulation by a capacitance ratio between $C_{FD}$ and $C_S$, respectively). FIG. 10D shows a status appearing before $\Phi_T$ is returned to be off.

Then, $\Phi_T$ is set to be off whereas $\Phi_S$ is set to be on and, under such a status, $\Phi_R$ is set to be on to discharge a whole of the photoelectric charges created in this field for resetting as shown in FIG. 9A for a shift to a subsequent field.

Next, description is made of a circuit structure of an overall CMOS image sensor composed of an integrated array of the pixels with the structure mentioned above.

Figure 11:
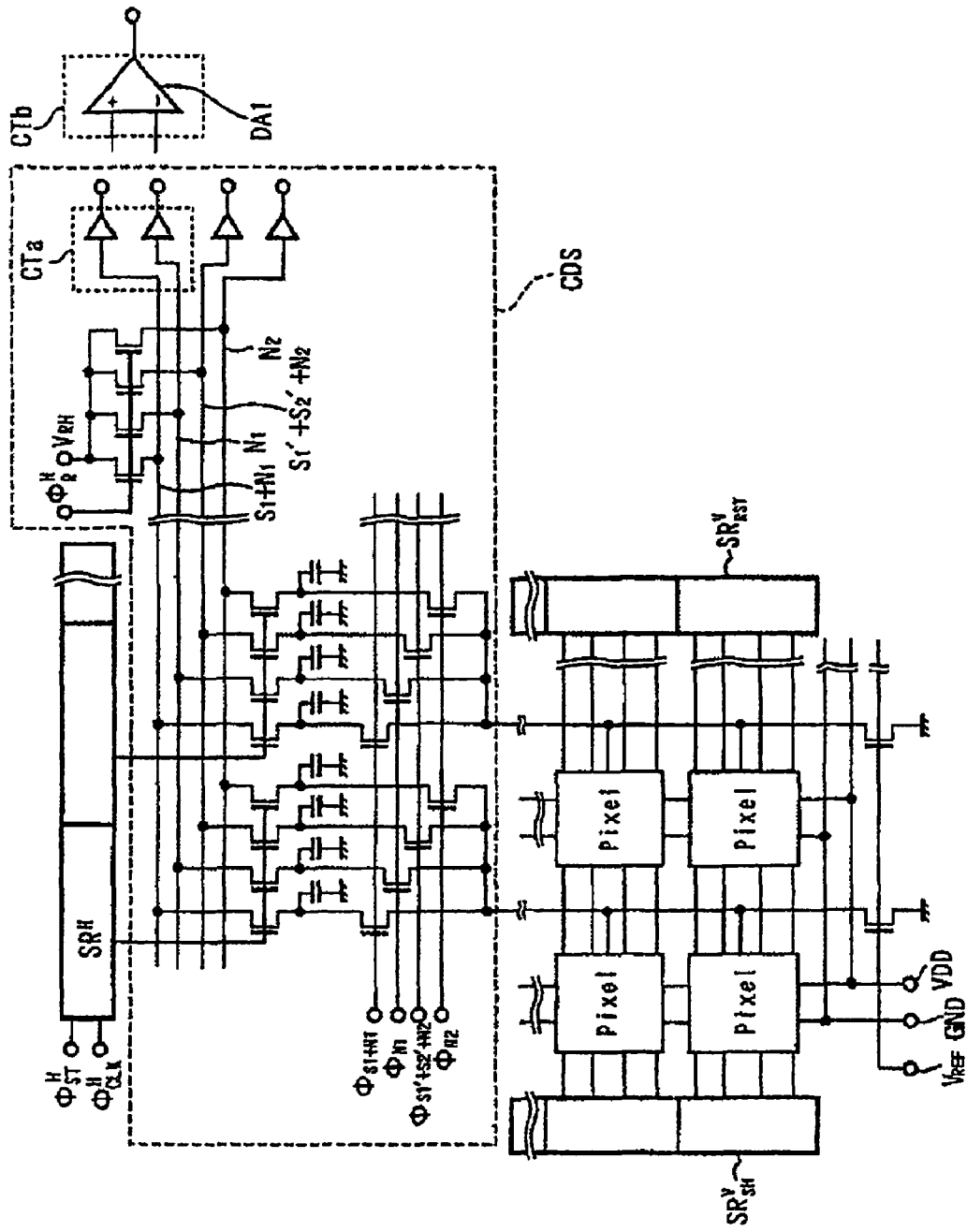
FIG. 11 is an equivalent circuit diagram showing an overall circuit structure of the CMOS image sensor of the first embodiment according to the present invention.

FIG. 11 is an equivalent circuit diagram showing an overall circuit structure of the CMOS image sensor of the present embodiment.

A plurality (with four pieces typically shown in the drawing figure) of pixels (Pixel) is placed in an array and S/H line shift registers $SR^V_{SH}$ for controlling drivelines ($\Phi_T$, $\Phi_S$, $\Phi_R$) and resetting line shift registers $SR^V_{RST}$ for controlling drivelines ($\Phi_R$) are connected to the respective pixels (Pixel) to which a power supply VDD and ground GND are also connected.

The respective pixels are controlled by the row shift register $SR^H$ and the drivelines ($\Phi_{S1+N1}$, $\Phi_{N1}$, $\Phi_{S1'+S2'+N2}$, $\Phi_{N2}$) using a CDS (correlation double sampling) circuit to output four values, including the pre-saturated charge signal $(S_1')$+$C_{FD}$ noise $(N_1)$, $C_{FD}$ noise $(N_1)$, a modulated pre-saturated charge signal $(S_1')$+a modulated supersaturated charge signal $(S_2')$+$C_{FD}+C_S$ noise $(N_2)$ and $C_{FD}+C_S$ noise $(N_2)$, through respective output lines at respective timings.

Here, since respective output terminals $CT_a$, on which the pre-saturated charge signal $(S_1)$+$C_{FD}$ noise $(N_1)$ and $C_{FD}$ noise $(N_1)$ are present, serve to extract a differential component between these factors as described below, a CMOS image sensor chip may be formed with a circuit $CT_b$ including a differential amplifier DA1.

Figure 12A:
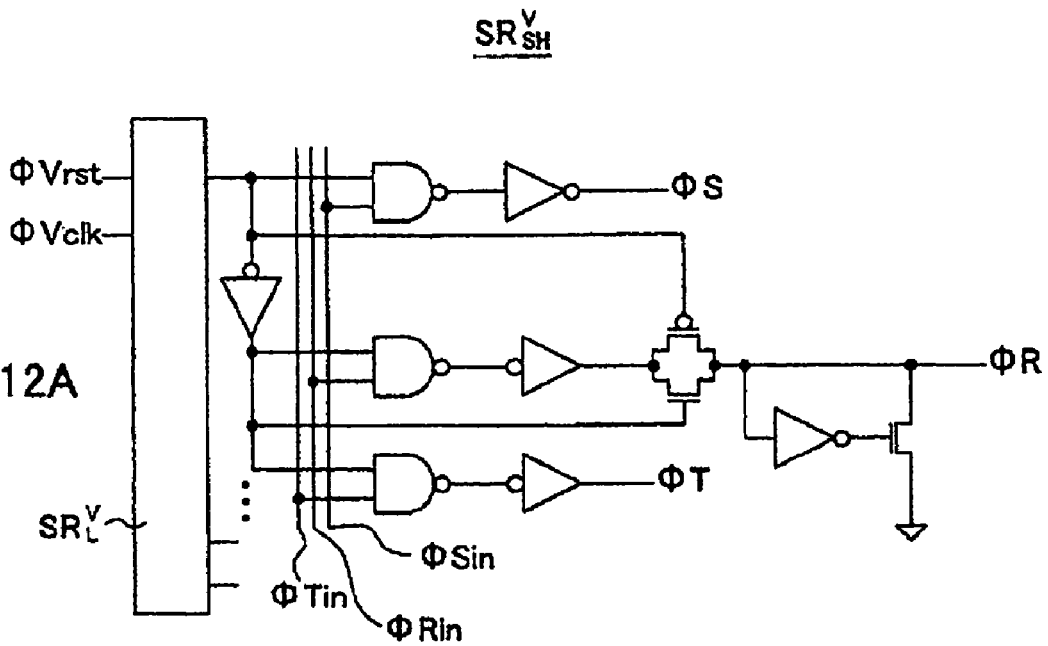
FIGS. 12A and 12B are circuit diagrams showing structures of line shift registers of the CMOS image sensor of the first embodiment according to the present invention.
Figure 12B:
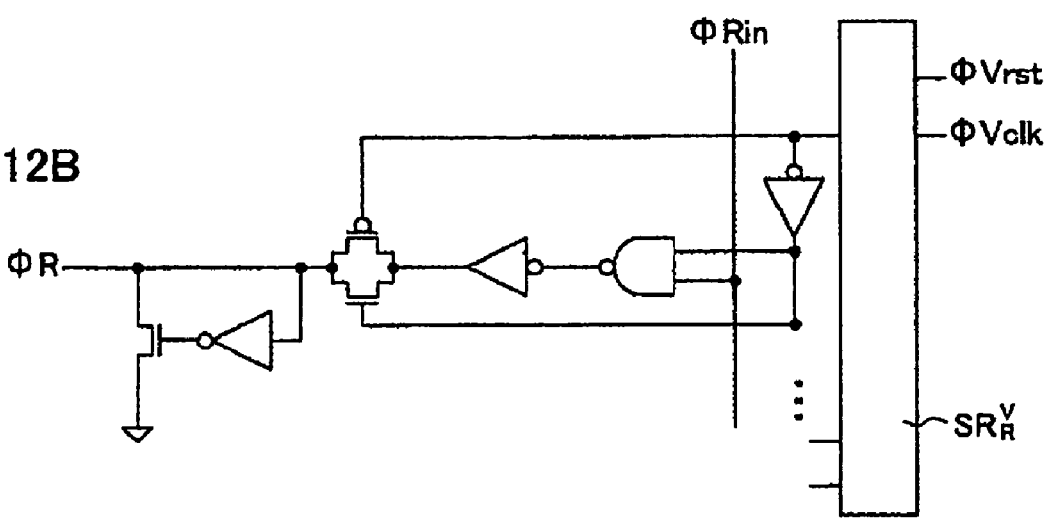

Next, FIGS. 12A and 12B show circuit diagrams of the S/H line shift register $SR^V_{SH}$ and the resetting line shift register $SR^V_{RST}$ forming a circuitry for realizing the drive shown in FIG. 8, respectively.

The S/H line shift register $SR^V_{SH}$ includes a left-side line shift register $SR^V_L$ to which the drivelines ($\Phi_S$, $\Phi_R$, $\Phi_T$) are connected. In the meanwhile, the resetting line shift register $SR^V_{RST}$ includes a right-side line shift register $SR^V_{RST}$ to which the driveline ($\Phi_R$) is connected.

With a usual CMOS imaging device, the operations are simultaneously executed for resetting the pixels and reading out pixel information during a horizontal blanking period. Therefore, the CMOS imaging device may take the form of a structure wherein an enable signal for a shift register is selected in one line of one frame to simply shift the pixel by one line each time one line is read out. The S/H line shift register $SR^V_{SH}$ corresponds to such a shift register. However, with such a structure, the drive shown in FIG. 8 cannot be realized.

Therefore, the present embodiment newly incorporates the resetting line shift register $SR^V_{RST}$ that is in charge of the resetting operation. For instance, the S/H line shift register $SR^V_{SH}$ and the resetting line shift register $SR^V_{RST}$ are disposed in a way to sandwich a photo receiver section in which the pixels are disposed. This enables the selection of plural lines in one frame with capability of realizing the drive shown in FIG. 8.

In FIG. 8, a falling edge timing of $\Phi_R$ is regulated to adjust timing at which the storage-capacitor-element accumulation period $T_{CS}$ begins. When using the resetting line shift register $SR^V_{RST}$, the resetting line shift register $SR^V_{RST}$ is arranged to send a reset pulse at a cycle of one line in synchronism with a second rest pulse from the S/H line shift register $SR^V_{SH}$ during a period except for the storage-capacitor-element accumulation period $T_{CS}$.

FIGS. 13A and 13B show waveforms of $\Phi_{Rin}$ to be input to the circuitry including the S/H line shift register $SR^V_{SH}$ (on the left side) and the resetting line shift register $SR^V_{RST}$ (on the right side) shown in FIGS. 12A and 12B, respectively.

Further, FIGS. 13C and 13D show initial signals being input to the circuitry including the S/H line shift register $SR^V_{SH}$ (on the left side) and the resetting line shift register $SR^V_{RST}$ (on the right side).

Here, $\Phi V_{RST}$ (left) includes one pulse for one frame and only one line is selected in one frame. This is because no selection is made for plural lines for performing the readout. In the meanwhile, $\Phi V_{RST}$ (right) includes a plurality of pulses in one frame. If, for instance, a CMOS image sensor with 512 lines are applied with 256 pulses, in case of disregarding the a horizontal blanking period, the accumulation time $T_{CS}$ for the floating diffusion region and the storage capacitor element takes a value of 256/512, that is, a half of a case (in which the storage-capacitor-element accumulation time $T_{CS}$ begins at time $T_0$) in which timing at which the storage-capacitor-element accumulation time $T_{CS}$ begins is not adjusted.

Figure 14:
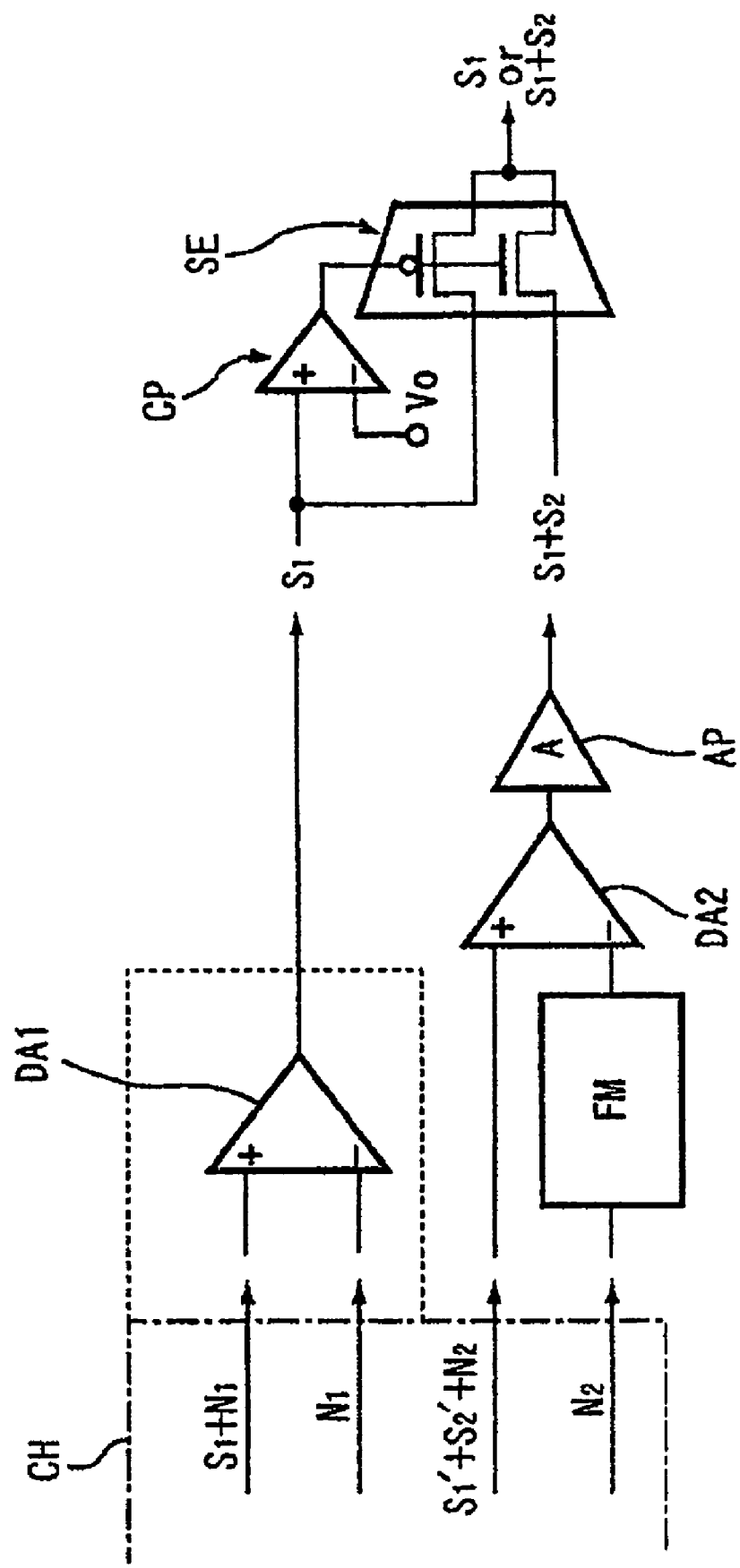
FIG. 14 is a circuit diagram for executing the processing of four signals including a pre-saturated charge signal+$C_{FD}$ noise, $C_{FD}$ noise, a modulated supersaturated charge signal+$C_{FD}$+$C_S$ noise, and $C_{FD}$+$C_S$ noise.

FIG. 14 shows a circuit for processing four signals including the pre-saturated charge signal $(S_1)+C_{FD}$ noise $(N_1)$, $C_{FD}$ noise $(N_1)$, the modulated pre-saturated charge signal $(S_1')+$ the modulated supersaturated charge signal $(S_2')+C_{FD}+C_S$ noise $(N_2)$ and $C_{FD}+C_S$ noise $(N_2)$ which are output in the manner previously mentioned.

Among the outputs described above, the pre-saturated charge signal $(S_1)+C_{FD}$ noise $(N_1)$ and $C_{FD}$ noise $(N_1)$ are input to the differential amplifier DA1 to extract a differential component between these inputs for canceling $C_{FD}$ noise $(N_1)$ and the pre-saturated charge signal $(S_1)$ is obtained.

In the meanwhile, the modulated pre-saturated charge signal $(S_1')+$the modulated supersaturated charge signal $(S_2')+C_{FD}+C_S$ noise $(N_2)$ and $C_{FD}+C_S$ noise $(N_2)$ are input to a differential amplifier DA2 to extract a differential component between these inputs cancels $C_{FD}+C_S$ noise $(N_2)$ for canceling $C_{FD}+C_S$ noise $(N_2)$. Further, using an amplifier AP to perform the demodulation with a capacitance ratio between $C_{FD}$ and $C_S$ allows the regulation to provide the same gain as that of the pre-saturated charge signal $(S_1)$ for thereby obtaining a signal of a sum $(S_1+S_2)$ of the pre-saturated charge signal and the supersaturated charge signal.

Here, as shown in the timing chart of FIG. 8, $C_{FD}+C_S$ noise $(N_2)$ is obtained at a relatively earlier time than the other signals and, hence, this signal is in the frame memory FM once until the other signal is obtained and read out from the frame memory FM at timing when the other signal is obtained for executing subsequent operations as described below.

The demodulations of the modulated pre-saturated charge signal $(S_1')+$the modulated supersaturated charge signal $(S_2')$, mentioned above, are described.

$S_1'$, $S_2'$, $\alpha$ (a charge distribution ratio between $C_{FD}$ and $C_{FD}+C_S$) and $\beta$ (a charge distribution ratio between $C_S$ and $C_{FD}+C_S$) are expressed by equations described below.

$$S_1'=S_1\times\alpha \tag{1}$$

$$S_2'=S_2\times\alpha\times\beta \tag{2}$$

$$\alpha=C_{FD}/(C_{FD}+C_S) \tag{3}$$

$$\beta=C_S/(C_{FD}+C_S) \tag{4}$$

Accordingly, using values of $C_{FD}$ and $C_S$ allows the above equations (3) and (4) to provide $\alpha$ and $\beta$ and substituting these factors to the above equations (1) and (2) performs the demodulation to $S_1+S_2$ for regulating the gain to the same gain as that of $S_1$ that is separately obtained.

Further, during the storage-capacitor-element accumulation time $T_{CS}$ set at a ratio of a given time period with respect to the accumulation time period $T_{PD}$ for the photodiode PD, a signal representing the photoelectric charges accumulated in the storage capacitor element $C_S$ is $S_2$ and multiplying $S_2$ by a ratio of $T_{PD}/T_{CS}$ enables the demodulation to a signal representing the photoelectric charges accumulated in the storage capacitor element $C_S$ when capturing in a whole of an imaging period.

Next, as shown in FIG. 14, either one of $S_1$ and $S_1+S_2$ obtained in the manner described above is selected and finally provided as an output.

To this end, first, $S_1$ is input to a comparator CP for comparison with a reference voltage $V_0$ that is preset. In the meanwhile, $S_1+S_2$ is input to a selector SE and either one of $S_1$ and $S_1+S_2$ is selectively output depending on the output of the comparator CP discussed above. The reference voltage $V_0$ is selected to take a voltage potential depending on a capacity of the photodiode prior to the saturation thereof and lies at a voltage such as, for instance, about 0.23V.

That is, if a result is negative upon subtracting $V_0$ from $S_1$, that is, if $S_1$ is less than $V_0$, then, judgment is made that no saturation occurs in the photodiode PD and $S_1$ is output.

On the contrary, if the result is positive upon subtracting $V_0$ from $S_1$, that is, if $S_1$ is greater than $V_0$, then, judgment is made that saturation occurs in the photodiode PD and $S_1+S_2$ is output.

For example, a circuitry covering up to these outputs may be formed on the CMOS image sensor chip CH and a circuitry including the rest of circuit elements covering the differential amplifier DA1 and the frame memory FM may be realized as an external circuitry. Moreover, the differential amplifier DA1 may be formed on the CMOS image sensor chip CH as described above.

Further, due to an increase in volume of analog data to be handled in the circuitry including the rest of the circuit elements covering the differential amplifier DA1 and the frame memory FM, analog data may be subject to A/D conversion before they are applied to the differential amplifier DA1 and the frame memory FM to allow analog data including the rest of signals delivered from the differential amplifier DA1 and the frame memory FM to be digitized. However, if the demodulation (amplification) is executed with the above-described ratio of $T_{PD}/T_{CS}$ upon digitization, amplification occurs even in discontinuity resulting from digitization and, hence, analog data may be preferably digitized after the demodulation (amplification) as far as possible. For example, analog data may be preferably amplified on a preceding stage using an amplifier (not shown) in compliance with an input range of the A/D converter.

As set forth above, the CMOS image sensor of the present embodiment results in a consequence of obtaining two signals, for one field per one pixel, which includes the pre-saturated charge signal (S1) and the signal of the sum ($S_1+S_2$) of the pre-saturated charge signal and the supersaturated charge signal. Either one of $S_1$ and $S_1+S_2$ is selected upon making judgment whether the photodiode PD ($C_{PD}$) is saturated or stands in a status close to it.

Under a situation where no adjustment is made on timing at which the storage-capacitor-element accumulation period $T_{CS}$ begins (in a case where the storage-capacitor-element accumulation period $T_{CS}$ begins at time $T_0$), the accumulation time period $T_{PD}$ for the photodiode PD and the storage-capacitor-element accumulation period $T_{CS}$ are nearly equal to each other and in case of 30 fps, both fall in 33 milliseconds. In this case, while all the photoelectric charges, exceeding the saturation amount of the photodiode PD, overflow to the storage capacitor element $C_S$, the storage capacitor element $C_S$ is flooded with the photoelectric charges during high illuminance with the resultant difficulty in getting information in high illuminance. In the meanwhile, with the present embodiment, the accumulation time period $T_{PD}$ for the photodiode PD includes a period in which $\Phi_R$ is set to be on with the resultant additional function for selectively discharging the photoelectric charges, exceeding $\Phi_T$ on an initial stage of exposure time and overflowing from the storage capacitor element CS, to VDD. This function enables not to cause the storage capacitor element $C_S$ to be flooded with the photoelectric charges even in high illuminance to widen a range of a high illuminance region that can be measured and a dynamic range can be widened.

Figure 15:
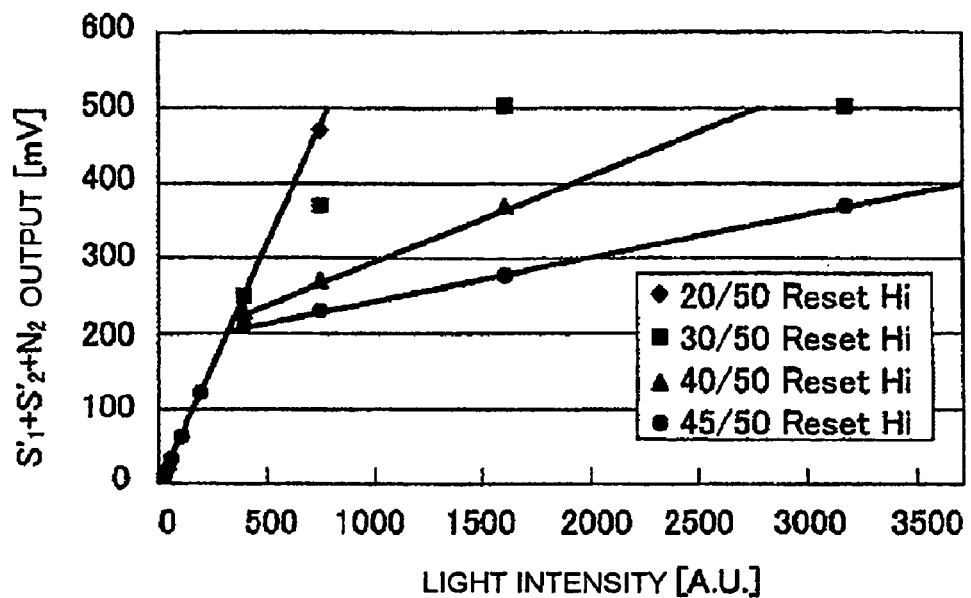
FIG. 15 is a view representing a signal ($S_1'$+$S_2'$+$N_2$) plotted in terms of a light intensity (in a relative value) in the first embodiment according to the present invention.

FIG. 15 is a view in which the signal ($S_1'+S_2'+N_2$), obtained in the manner mentioned above, is plotted in terms of light intensity (at a relative value) for the accumulation time periods of 20/50, 30/50, 40/50 and 50/50 each in a length of time period for the reset to be on.

In this drawing figure, limiting the accumulation time period $T_{CS}$ of the storage capacitor element $C_S$ in delay of the falling edge timing of $\Phi_R$ causes a gradient of an output-to-light intensity in high illuminance to mildly vary. Thus, information in high illuminance can be compacted with no flooding taking place in the storage capacitor element $C_S$ with less probability of saturation even in the presence of information in further increased illumination being input.

In a case where the storage-capacitor-element accumulation period $T_{CS}$ begins at time $T_0$, the saturation takes place with an output of 500 mV at light intensity of 800. If the storage-capacitor-element accumulation period $T_{CS}$ is set to a value of 5/50 (with a time period for the resetting to be on falling in a value of 45/50) of the accumulation time period $T_{PD}$ for the photodiode, no saturation takes place even with light intensity of 3500. Even in such a case, no drop occurs in sensitivity in low illuminance.

With the driving method according to the present invention, a dynamic range can be expanded so as to avoid the saturation of only information in high illuminance without causing deterioration in sensitivity in low illuminance and an S/N ratio.

The storage-capacitor-element accumulation period $T_{CS}$ for the accumulation time period $T_{PD}$ for the photodiode is limited to widen a dynamic range in theoretical values indicated below.

TABLE 1

| $T_{PD}/T_{CS}$ | Saturation Light Intensity | Increase in Dynamic Range |
|---|---|---|
| 100% | 1 (Reference) | — |
| 20% | 3.0 times | +9.5 dB |
| 10% | 5.8 times | +15.3 dB |
| 5% | 9.9 times | +19.9 dB |

With the structure of the CMOS image sensor of the present embodiment and the operating method mentioned above, of the two signals including the pre-saturated charge signal ($S_1$) and the signal of the sum ($S_1+S_2$) of the pre-saturated charge signal and the supersaturated charge signal, the pre-saturated charge signal ($S_1$) is adopted under an unsaturated state of the photodiode PD ($C_{PD}$) whereas if the photodiode PD is saturated, the signal of the sum ($S_1+S_2$) of the pre-saturated charge signal and the supersaturated charge signal is adopted.

Thus, during the shooting in low illuminance with no saturation of the photodiode PD, the pre-saturated charge signal ($S_1$), resulting from canceling noise, enables to have high sensitivity and a high S/N ratio. Further, during the shooting in high illuminance with the photodiode PD being saturated, the storage capacitor element accumulates and takes the photoelectric charges overflowing from the photodiode at the given ratio described above in the storage-capacitor-element accumulation period that is preset to be a period at a predetermined ratio with respect to the accumulation time period of the photodiode and, in a manner similar to the above, the signal of the sum ($S_1+S_2$) of the pre-saturated charge signal and the supersaturated charge signal enables to have high sensitivity and a high S/N ratio.

With the CMOS image sensor of the present embodiment, sensitivity in high illuminance can be raised to achieve a widened dynamic range without causing a drop in sensitivity in low illuminance as described above. In addition, since no level of the power supply voltage is raised from a range in common use, a miniaturization of a future image sensor can be coped.

The addition of the number of elements is limited to a minimal value with no probability in causing an increase in a size of a pixel.

Further, the image sensor of the present embodiment has no need to split the accumulation time for high illuminance and low illuminance as done in the image sensor of the related art for realizing a wide dynamic range, that is, the photoelectric charges are accumulated in the same accumulation time period without striding frames with the resultant capability of coping the shooting of moving images.

Further, with respect to leakage current (FD leakage) of the floating diffusion region FD, the image sensor of the present embodiment has a minimal signal of $C_{FD}+C_S$ that takes the supersaturated charges+the saturated charges from the photodiode PD to handle the amount of charges greater than that of the charges from the FD leakage with the resultant advantageous effect to be less subjected to FD leakage.

Second Embodiment

A CMOS image sensor of the present embodiment is similar to the CMOS image sensor of the first embodiment but differs therefrom in a driving method.

Figure 16:
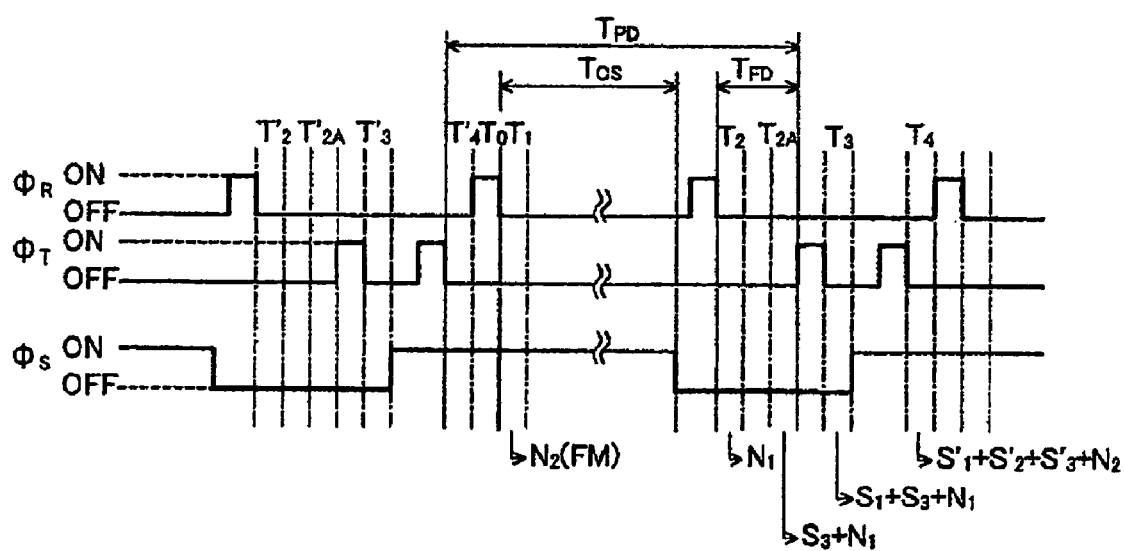
FIG. 16 is a timing chart of voltages applied to drivelines ($\Phi_T$, $\Phi_S$, $\Phi_R$) of a CMOS image sensor of a second embodiment according to the present invention.

FIG. 16 is a timing chart showing voltages applied to the drivelines ($\Phi_T$, $\Phi_S$, $\Phi_R$) each with two levels in on/off states. Like the first embodiment, $\Phi_T$ may take three levels additionally including a level (+α).

First, at time $T_0$ when a new filed begins, $\Phi_R$ is set to be on under a status where $\Phi_T$ is set to be off and $\Phi_S$ is set to be on. This causes the photoelectric charges created in a preceding field to be discharged for resetting.

The accumulation time period $T_{PD}$ for $C_{PD}$ begins at a time point when $\Phi_T$ is set to be off to allow $C_{PD}$ to start accumulating the photoelectric charges.

Next, at time $T_1$ immediately after the resetting at time $T_0$, $\Phi_R$ is set to be off. At this moment, $C_{FD}$ and $C_S$ are brought into a coupled condition and a signal of $C_{FD}+C_S$ at a reset level is read out as noise $N_2$ for storage in the frame memory FM. During supersaturated operation, since noise $N_2$ is sufficiently less than the signal of the pre-saturated charges+ supersaturated charges, noise $N_3$ may be used in place of noise $N_2$ in a manner described below.

At time $T_1$, the storage-capacitor-element accumulation period $T_{CS}$ begins and the photoelectric charges overflowing from $C_{PD}$ begins to be accumulated in $C_S$.

In such away, if the amount of photoelectric charges is less than that saturating $C_{PD}$, then, the photoelectric charges are accumulated only in $C_{PD}$. If the amount of photoelectric charges is greater than that saturating $C_{PD}$, then, the photoelectric charges are accumulated in, in addition to $C_{PD}$, $C_{FD}$ and $C_S$.

Subsequently, at the end of the storage-capacitor-element accumulation period $T_{CS}$, $\Phi_S$ is set to be off to cause the potential of $C_{PD}$ and $C_S$ to be split. This terminates the accumulation of the charges to the storage capacitor element $C_S$.

Then, $\Phi_R$ is set to be on to cause the photoelectric charges to be discharged from $C_{PD}$ for resetting and at time $T_2$ immediately after the resetting, $\Phi_R$ is returned to be off for reading out a signal at a reset level of $C_{PD}$ as noise $N_1$.

Here, a time period from time $T_2$ to time at which $\Phi_T$ is set to be on for the purpose of transferring the pre-saturated charges from $C_{PD}$ to $C_{FD}$ corresponds to a floating diffusion region accumulation time period $T_{FD}$. Under a status where the potential of the floating diffusion region FD and the storage capacitor element $C_S$ is split, the photoelectric charges overflowing from the photodiode FD are accumulated in the floating diffusion region FD. At time $T_{2A}$ immediately before $\Phi_T$ is set to be on at the end of the floating diffusion region accumulation time period $T_{FD}$, a supersaturated charge signal (an ultra high illuminance signal) $S_3$, accumulated in the floating diffusion region FD in the floating diffusion region accumulation time period $T_{FD}$, is read out. However, here, since $C_{FD}$ noise is present, what is actually read out is a signal of $S_1+S_2$.

A time period from the resetting at time $T_2$ to the resetting again at time $T_0$ is normally referred to as a horizontal blanking period. With the present embodiment, using a portion of the horizontal blanking period allows the photoelectric charges overflowing from the photodiode PD to be accumulated in the floating diffusion region FD for thereby generating the supersaturated charge signal. The floating diffusion region accumulation time period $T_{FD}$ can be adjusted for unit of one line.

Next, $\Phi_T$ is set to be on and the pre-saturated charges are transferred from $C_{PD}$ to $C_{FD}$. Here, the potential of $C_{PD}$ is shallower than $C_{FD}$ and a level of the transfer transistor is deeper than $C_{PD}$. Thus, complete charge transfer can be realized to transfer all of the pre-saturated charges from $C_{PD}$ to $C_{FD}$.

Here, $\Phi_T$ is returned to be off at time $T_3$ for reading out a signal, involving the pre-saturated charge signal $S_1$, from the pre-saturated charge signal transferred to $C_{FD}$. However, here, since the supersaturated charge signal $S_3$ is previously present and additionally, $C_{FD}$ noise is present, what is actually read out represents a signal of $S_1+S_3+N_1$.

Next, $\Phi_S$ is set to be on and $\Phi_T$ is consecutively set to be on to couple the potentials of $C_{PD}$ and $C_{FD}$ for mixing the pre-saturated charges+ultra-supersaturated charges in $C_{PD}$ and the supersaturated charges in $C_S$.

Here, $\Phi_T$ is returned to be off at time $T_4$ for reading out a charge signal spread in $C_{FD}+C_S$. When this takes place, the pre-saturated charges+the ultra-supersaturated charges+the supersaturated charges are present in $C_{FD}+C_S$ and a signal of a sum of the pre-saturated charges $S_1$+the supersaturated charges $S_2$+the ultra-supersaturated charges $S_3$ is read out. However, here, since $C_{FD}+C_S$ noise is present and the sum signal is read out from the charges spread in $C_{FD}+C_S$, what is actually read out includes a signal $S_1'+S_2'+S_3'+N_2$ (with $S_1'$, $S_2'$ and $S_3'$ remaining at values of $S_1$, $S_2$ and $S_3$ contracted in modulation at a capacitance ratio between $C_{FD}$ and $C_S$).

Subsequently, $\Phi_R$ is set to be on under a status where $\Phi_T$ is set to be off and $\Phi_S$ is set to be on in a manner previously mentioned for discharging all of the photoelectric charges generated in this field for shift to a subsequent field.

Various signals are generated based on various charge signals, obtained in the manner mentioned above, in a manner described below.

Specifically, first, a differential component between the signal $S_3+N_1$, obtained at time $T_{2A}$, and the signal $N_1$ obtained at time $T_2$ is taken and the ultra-supersaturated charge signal $S_3$ whose noise is cancelled is generated.

Further, a differential component between the signal $S_1+S_3+N_1$, obtained at time $T_3$, and the signal $S_3+N_1$, obtained at time $T_{2A}$, is taken and the pre-saturated charges $S_1$ whose noise is cancelled is generated.

Furthermore, the signal $S_1'+S_2'+S_3'+N_2$, obtained at time $T_4$, and the signal $N_2$ obtained at time $T_1$ is taken and the signal $S_1'+S_2'+S_3'$ whose noise is cancelled is generated. Additionally, the signal is demodulated at the capacitance ratio between $C_{FD}$ and CS in the same sequence as that of the first embodiment. Moreover, a differential component between this signal and the signal $S_3$, previously obtained, is taken thereby generating a signal of the pre-saturated charge signal $S_1$+the supersaturated charge signal $S_2$. However, if the signal $S_3$ is sufficiently less than the signal $S_1+S_2$, no differential component is taken and the signal $S_3$ may be disregarded.

The ultra-supersaturated charge signal $S_3$, obtained in the manner set forth above, plays a role as a signal representing photoelectric charges accumulated in the floating diffusion region FD in the floating diffusion region accumulation time period $T_{FD}$ that is preset to be a period at a predetermined ratio with respect to the accumulation time period $T_{PD}$ of the photo diode PD. Therefore, multiplying the signal $S_3$ by a ratio γ of $T_{PD}/T_{FD}$ enables the demodulation of the signal ($S_3 \times \gamma$) of the photoelectric charges accumulated in the floating diffusion region FD when capturing during an overall imaging period.

For instance, in case of 30 fps, the imaging period ($T_{PD}$) is 33 seconds and the floating diffusion region accumulation time period $T_{FD}$ is preset within the horizontal blanking period to be as long as approximately 10 microseconds. In this case, multiplying a ratio of 33 milliseconds/10 microseconds can demodulate the signal S3.

Any one of the three signals ($S_1$, $S_1+S_2$, $S_3 \times \gamma$), obtained in the manner described above, can be selected using a comparator and a selector in the same manner as that of the first embodiment.

Figure 17:
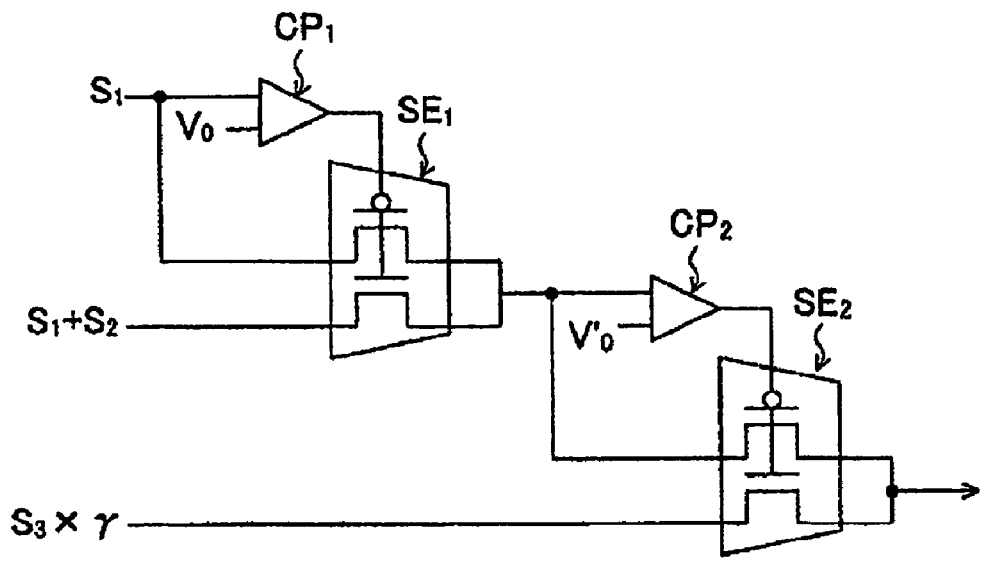
FIG. 17 is a circuit diagram for executing the processing of three signals including a pre-saturated charge signal, the pre-saturated charge signal+a supersaturated charge signal, and a demodulated ultra-supersaturated charge signal.

FIG. 17 is a circuit diagram for selecting and outputting one of the three signals ($S_1$, $S_1+S_2$, $S_3 \times \gamma$) described above.

To this end, first, the signal $S_1$ is input to a comparator $CP_1$ for comparison with a reference voltage potential $V_0$ that is preset. In the meanwhile, the signal $S_1+S_2$ is input to a selector $SE_1$ and either one of the signals $S_1$ and $S_1+S_2$ is selected and output depending on an output of the comparator $CP_1$. The reference voltage potential $V_0$ is selected to have a preceding voltage potential prior to the saturation of the photodiode PD depending on the capacitance thereof.

Then, an output of the selector $SE_1$ is input to a comparator $CP_2$ for comparison with a reference voltage potential $V_0'$ that is preset. In the meanwhile, the output of the selector $SE_1$ and the signal $S_3 \times \gamma$ is input to a selector $SE_2$ and either one of the output of the selector $SE_1$ and the signal $S_3 \times \gamma$ is selected and output depending on an output of the comparator $CP_2$. The reference voltage potential $V_0'$ is selected to have a preceding voltage potential prior to the saturation of the storage capacitor element $C_S$ depending on the capacitance thereof.

With the CMOS image sensor and the related driving method of the present embodiment mentioned above, the samplings are executed two times for low illuminance and high illuminance and, in addition, further information is obtained on ultra-high illuminance. This method premises on capability of obtaining adequate signal charges even for a short exposure time interval in high illuminance and canceling kTC noise. The CMOS image sensor with a dynamic range proposed in the related art has undergone increased noise during switchover between the signals and encountered a difficulty in use. In contrast, with the present embodiment, additionally providing the storage capacitor element $C_S$ results in an increase in a dynamic range. This enables the minimization of deterioration in an S/N ratio during switchover between a high illumination signal and a low illuminance signal.

Figure 18:
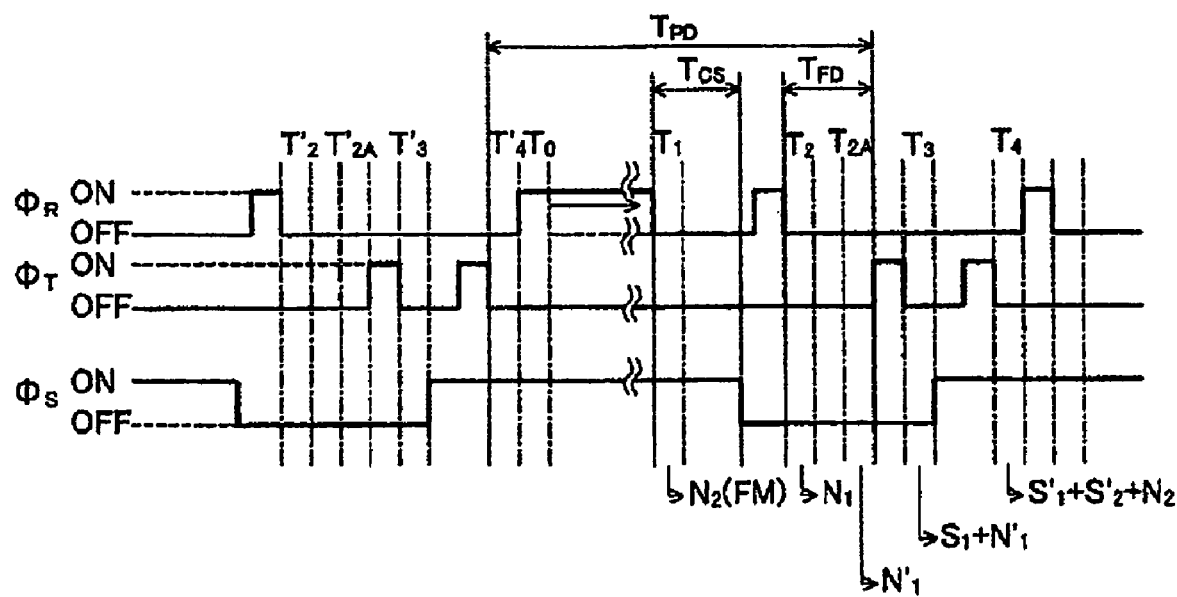
FIG. 18 is a timing chart of voltages applied to the drivelines ($\Phi_T$, $\Phi_S$, $\Phi_R$) of the CMOS image sensor of the second embodiment according to the present invention.

Further, FIG. 18 is a timing chart of voltages applied to drivelines under a situation where the driving method of the present embodiment for obtaining the three signals ($S_1$, $S_1+S_2$, $S_3 \times \gamma$) is combined with the driving method shown in the first embodiment. Setting the storage-capacitor-element accumulation period $T_{CS}$ for obtaining the signal $S_2$ to be a period at a predetermined ratio with respect to $T_{PD}$ allows a further increase in a dynamic range. Thus, deterioration in an S/N ratio during switchover between the high illumination signal and the low illuminance signal can be further suppressed.

As set forth above, $T_{FD}$ lies at a value of approximately 10 microseconds and Table 2 represents S/N ratios in the worst case wherein the numbers of charges generated for a period of 1/30 seconds during the saturation of the storage capacitor element $C_S$ lies at values of 200 ke⁻, 400 ke⁻, 800 ke⁻ and 2000 ke⁻. Here, assumption is made that noise component lies in a value of 5 ke⁻.

TABLE 2

| Number of Charges generated for 1/30 sec | Number of Charges accumulated in $C_{PD}$ for 10 microseconds | S/N (dB) |
| --- | --- | --- |
| 200 ke⁻ | 60 e⁻ | 21.6 |
| 400 ke⁻ | 120 e⁻ | 27.6 |
| 800 ke⁻ | 240 e⁻ | 33.6 |
| 2000 ke⁻ | 606 e⁻ | 41.7 |

As shown in Table 2, handling two hundred thousand charges for an exposure time of 1/30 seconds results in an S/N ratio of approximately 21.6 dB. If adding the storage capacitor element $C_S$ allows the two hundred thousand charges to be handled and using a technique of the first embodiment allows the handling of two million charges, an adequate S/N ratio can be enhanced in the order greater than 40 dB at a time point of switchover between the signals.

In the meanwhile, an increase in a dynamic range is represented intact by a ratio between the accumulation time period $T_{FD}$ (10 microseconds) for the floating diffusion region FD and the accumulation time period $T_{PD}$ (33 milliseconds) for the photodiode PD. The present embodiment increases a dynamic range by +70 dB while adding the storage capacitor $C_S$ increases the dynamic range to that of high illuminance from +20-40 dB to 30-50 dB to allow a total dynamic range to be 190 dB.

With the structure of the CMOS image sensor of the present embodiment and the operating method mentioned above, either one of the three signals including the pre-saturated charge signal $S_1$, the signal of the sum ($S_1+S_2$) of the pre-saturated charge signal and the supersaturated charge signal and the ultra-supersaturated charge signal $S_3 \times \gamma$ is adopted depending on the saturation of the photodiode PD and the saturation of the storage capacitor element $C_S$.

Thus, during the shooting in low illuminance with no saturation of the photodiode PD, using the pre-saturated charge signal ($S_1$) resulting from canceling noise enables a high S/N ratio to be kept. Further, during the shooting in high illuminance with the saturation of the photodiode PD, the storage capacitor element accumulates and takes in the photoelectric charges overflowing from the photodiode and the signal (corresponding to the sum ($S_1+S_2$) of the pre-saturated charge signal and the supersaturated charge signal) obtained by canceling noise in the same manner as described above enables an increase in an S/N ratio while increasing a dynamic range to a high illuminance level. Furthermore, during the shooting in ultra-high illuminance with the saturation of the storage capacitor element, causing the storage capacitor element to accumulate and take in the photoelectric charges overflowing from the photodiode at a given ratio in the floating diffusion region accumulation period that is preset to be a period at a predetermined ratio with respect to the accumulation time period of the photodiode and using the signal (the ultra-supersaturated charge signal ($S_3 \times \gamma$)) obtained by canceling noise accompanied by demodulation in the same manner as described above enables an increase in an S/N ratio to realize a wide dynamic range on a high illuminance level.

Like the first embodiment, the CMOS image sensor of the present embodiment increases sensitivity in high illuminance without causing a drop in sensitivity in low illuminance for achieving a wide dynamic range in the manner described above and the presence of a power supply voltage with no increase from a range in normal use enables to cope with the miniaturization of a future image sensor.

The addition of elements is minimized causing no increase in a size of a pixel.

Further, since no need arises for the accumulation time period to be split for high illuminance and low illuminance as required in the related art image sensor for realizing a wise dynamic range, that is, the photoelectric charges are accumulated in an accumulation time period with no striding over the frames, the image sensor of the present embodiment can cope with the shooting of moving images.

Furthermore, with the CMOS image sensor of the present embodiment, a minimal signal of $C_{FD}+C_S$ includes a results of the supersaturated charges resulting+the charges resulting from the photodiode PD. This results in capability of handling the greater amount of charges than those of leakage current (FD leakage) of the floating diffusion region FD with the resultant advantageous effect in which the CMOS image sensor is hard to suffer from an adverse affect of the FD leakage.

Third Embodiment

In the CMOS image sensors of the first and second embodiments or the CMOS image sensor of the first embodiment having a pattern in which the storage-capacitor-element accumulation period $T_{CS}$ begins at time $T_0$, the signal at the reset level of $C_{FD}+C_S$ is read out as noise $N_2$ and accumulated in the frame memory FM. This enables the canceling of noise appearing when sampling the signal of the sum $(S_1+S_2)$ of the pre-saturated charge signal and the supersaturated charge signal. On the contrary, a CMOS image sensor of the present embodiment enables a reduction in cost of a chip without using the frame memory.

The frame memory is needed because the sampling timing of the signal $(N_2)$ at the reset level of $C_{FD}+C_S$ precedes the sampling timing of the sum $(S_1'+S_2'+N_2)$ of the modulated pre-saturated charge signal and the supersaturated charge signal by one frame.

Here, the signal $(N_1)$ at the reset level of $C_{FD}+C_S$ may be replaced by the signal $(N_1)$ at the reset level of $C_{FD}$ or the signal $N_2$ (designated at $N_2"$). This enables the canceling of variation in a threshold value of an amplifier inside the pixel and, hence, the rest is kTC noise.

This noise results in variation in charges of $(kTC)^{1/2}$ and the larger the capacitance of the storage capacitor element $C_S$, the greater will be the extent of variation. However, this enables a dynamic range to be increased to a high illuminance level by a value greater than 20 dB. Thus, even if the storage capacitor element is set to have a capacitance of 40 fF, noise work out to lie at only a level equivalent to 82 charges.

In the meanwhile, signal charges appearing when performing switchover of data from a low illuminance level to a high illuminance level depend on a capacitance of a light receiving section and normally lie at a value greater than ten thousand electrons. In such a case, photo shot noise includes 100 electrons and making square sum of the above 82 electrons results in a value of 129 electrons. This corresponds to a slight amount of deterioration in an S/N ratio by a value from 40 dB to 37.8 dB.

Hereunder, detailed description is made of a concrete example of a circuit for using a signal $(N_1)$ at a reset level of $C_{FD}$ or a signal $N_2$ in a subsequent frame in place of the signal $(N_2)$ at a reset level of $C_{FD}+C_S$.

Figure 19A:
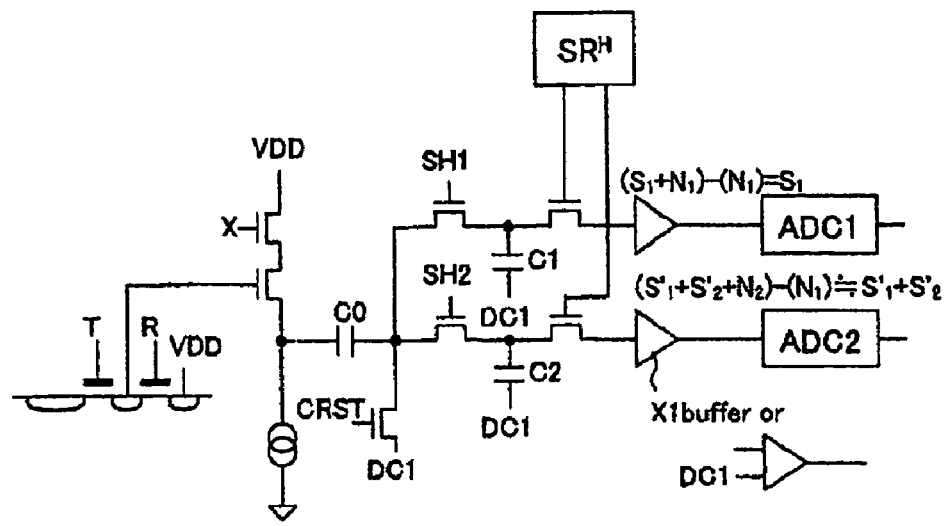
FIG. 19A is a circuit diagram showing a CDS circuit of a CMOS image sensor of a third embodiment according to the present invention and FIG. 19B is a timing chart showing voltages, applied to drivelines, and sampling timings.
Figure 19B:
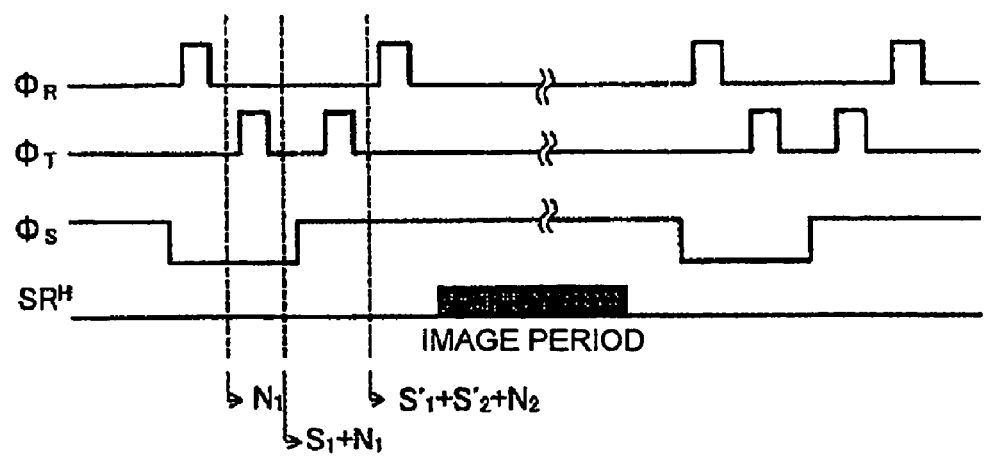

FIG. 19A shows a circuit diagram of a CDS circuit for realizing the use of the signal $(N_1)$ at the reset level of $C_{FD}$ in place of the signal $(N_2)$ at the reset level of $C_{FD}+C_S$ described above. Further, FIG. 19B is a timing chart representing voltages, applied to the drivelines, and sampling timings.

That is, the CDS circuit, shown in FIG. 19A, includes an alternating current coupling circuit, playing a role as a noise canceling circuit, which includes transistors SH1 and SH2 that are turned on and input during sampling of $N_1$, respectively. Subsequently, during sampling of $S_1+S_2$, the transistor SH1 is turned on to output an alternating current component, composed of a differential component between $S_1+S_2$ and $N_1$ that has been input on a preceding stage, which is input to an AD converter ADC1. Next, the transistor SH2 is turned on during sampling of $S_1'+S_2'+N_2$ to output an alternating current component, composed of a differential component between $S_1'+S_2'+N_2$ and $N_1$, which in turn is input to an AD converter ADC2. The differential component between $S_1'+S_2'+N_2$ and $N_1$ input on the preceding stage substantially includes $S_1'+S_2'$ with a rest of kTC noise.

Figure 20A:
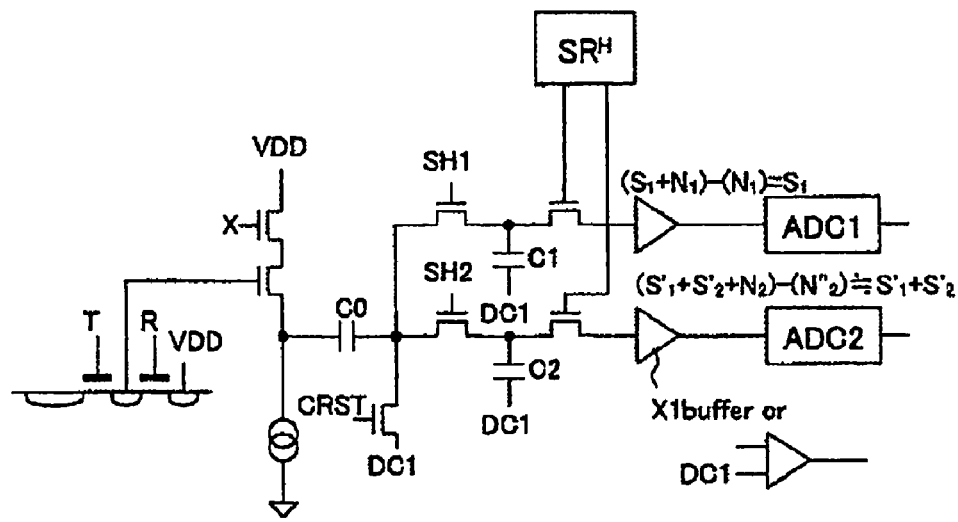
FIG. 20A is a circuit diagram showing a CDS circuit of a CMOS image sensor of the third embodiment according to the present invention and FIG. 20B is a timing chart showing voltages, applied to driveline, and sampling timings.
Figure 20B:
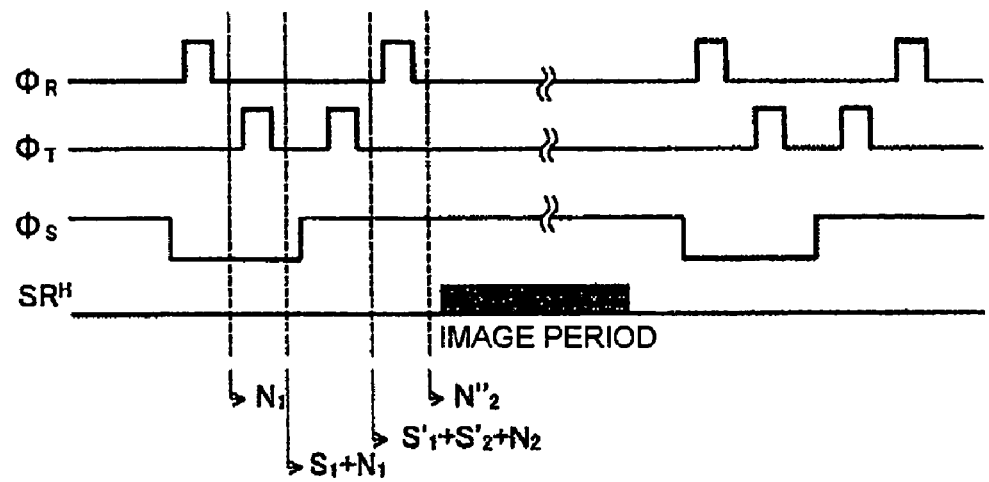

FIG. 20A shows a circuit diagram of a CDS circuit for realizing the use of the signal $(N_2")$ at the reset level of $C_{FD}+C_S$ in a subsequent frame in place of the signal $(N_2)$ at the reset level of $C_{FD}+C_S$ described above. Further, FIG. 20B is a timing chart representing voltages, applied to the drivelines and sampling timings.

That is, the CDS circuit, shown in FIG. 20A, includes an alternating current coupling circuit, playing a role as a noise canceling circuit, whose transistor SH1 is turned on and input during sampling of $N_1$. Subsequently, the transistor SH2 is turned on during sampling of $S_1+N_1$ to output an alternating current component, composed of a differential component between $S_1+N_1$ and $N_1$ that has been previously input, which is input to an AD converter ADC1.

Next, the transistor SH2 is turned on and input during sampling of $S_1'+S_2'+N_2$. Subsequently, during sampling of $N_2"$ in a subsequent frame, the transistor SH2 is turned on to output an alternating current component, composed of a differential component between $N_2"$ and $S_1'+S_2'+N_2$ that has been previously input, which is input to an AD converter ADC2. The differential component between $N_2"$ and $S_1'+S_2'+N_2$, which has been previously input, is inverted leaving kTC noise and substantially results in $S_1'+S_2'$.

FIG. 21A is a circuit diagram of a CDS circuit for realizing the use of the signal $(N_2")$ at the reset level of $C_{FD}+C_S$ in a subsequent frame in place of the signal $(N_2)$ at the reset level of $C_{FD}+C_S$ described above. Further, FIG. 21B is a timing chart representing voltages, applied to the drivelines, and sampling timings.

That is, the CDS circuit shown in FIG. 21A includes a two-capacitor type differential amplifier, playing a role as a noise canceling circuit. As shown in FIG. 21B, the CDS circuit shown in FIG. 21A is input with signals subjected to samplings at respective timings $N_1$, $S_1+N_1$, $S_1'+S_2'+N_2$ and $N_2"$. At this moment, a differential amplifier DA3 outputs a differential component between $S_1+N_1$ and $N_1$ and a differential amplifier DA4 outputs a differential component between $S_1'+S_2'+N_2$ and $N_2"$.

The respective timing charts, described above, correspond to the pattern in which the storage-capacitor-element accumulation period $T_{CS}$ begins at time $T_0$ in the first embodiment. The present invention is not limited to such correspondence and the present embodiment can also be applied to the methods of the first or second embodiments.

In the present embodiment, in addition to an increase in a dynamic range of each pixel wherein the storage capacitor element $C_S$ is connected to the photodiode via the transistor, a buffer circuit and an AD converter, specified only for outputting $N_2$, can be omitted and no need arises for providing a frame memory. This results in capability of simplifying a circuit with a reduction in cost of a chip while efficiently suppressing fixed pattern noise.

Fourth Embodiment

In the various embodiments set forth above or the CMOS image sensor of the first embodiment in the pattern in which the storage-capacitor-element accumulation period $T_{CS}$ begins at time $T_0$, the storage capacitor element $C_S$, connected to the photodiode via the transistor in each pixel, has no correlation with the floating diffusion region $C_{FD}$ and different tendencies in variation of gains for a case where voltage conversion is made only by the floating diffusion region capacitor $C_{FD}$ and a case where voltage conversion is made only by the floating diffusion region capacitor $C_{FD}$ and the storage capacitor element $C_S$.

Accordingly, combining a processing system for performing gain correction of the floating diffusion region capacitor $C_{FD}$ with a synthesizer circuit for synthesizing a signal in low illuminance and a signal in high illuminance makes it possible to suppress the occurrence of fixed pattern noise occurring during switchover of the signals with the resultant further improvement in quality of an image.

FIG. 22 is a block diagram showing a sequence of processing signals in the CMOS image sensor of the present embodiment.

A CMOS image sensor section 50 provides a sensor output that in turn is digitized in a preprocessing section 60 and subjected to signal processing by a gain table generating section 70 and a video data synthesizing section 80 to be output as video outputs (Video1, Video2).

The CMOS image sensor section 50 includes a plurality of pixels arrayed in matrix and corresponds to a circuitry including those adapted to provide outputs of the respective pixels as sensor outputs.

Figure 23A:
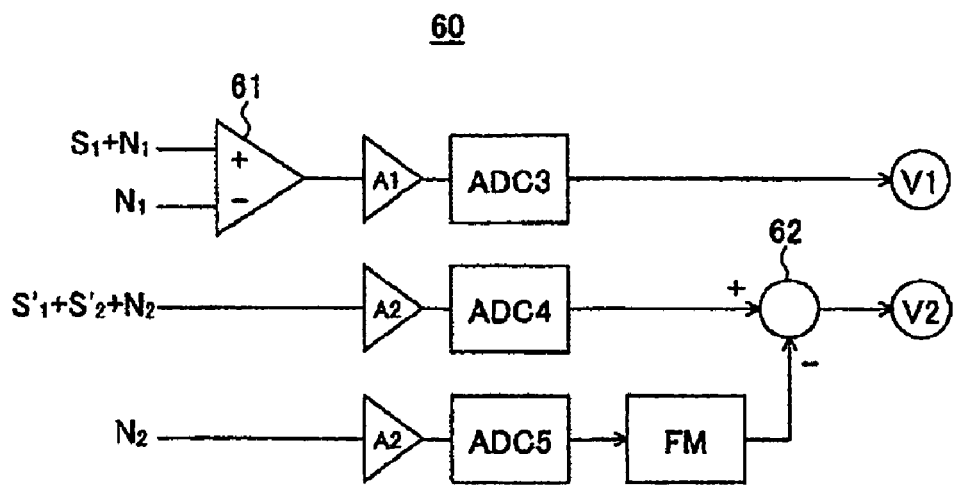
FIGS. 23A and 23B are block diagrams showing a structure of a preprocessing section of the CMOS image sensor of the fourth embodiment according to the present invention.

FIG. 23A is a block diagram showing a structure of the preprocessing section 60.

A differential amplifier 61 is input with the voltage signal $(S_1+N_1)$, resulting from the photoelectric charges transferred to the floating diffusion region, and the voltage signal $(N_1)$ at the reset level of the floating diffusion region and provides a first differential component that in turn is digitized by an AD comparator ADC3 to be output as a low-illuminance signal data $V_1$. Although the AD comparator ADC3 has a gain A1 for the purpose of allowing the voltage signal to match an input voltage range of the AD comparator ADC3, the differential amplifier 61 may also incorporate the gain A1.

Further, the voltage signal $(S_1'+S_2'+N_2)$, resulting from the photoelectric charges transferred to the floating diffusion region and the storage capacitor element, and the voltage signal $(N_2)$ at the reset level of the floating diffusion region and the storage capacitor element are processed to match input voltage ranges of AD comparators and digitized by the AD comparators (ADC 4, 5). The voltage signal $(N_2)$ at the reset level of the floating diffusion region and the storage capacitor element is output in an earlier stage than that of the other signal by one frame and stored in a frame memory FM. A subtraction block 62 takes a second differential component between $S_1'+S_2'+N_2$ and $N_2$ and provides an output as a high-illuminance signal data $V_2$.

Figure 23B:
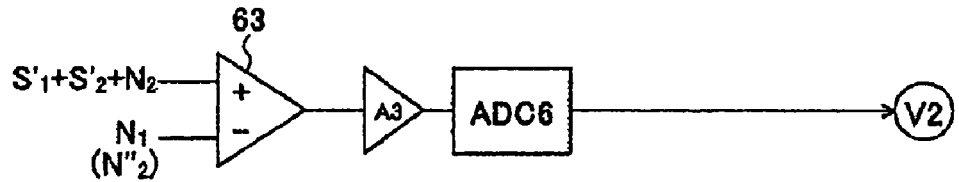

As shown in the third embodiment, when using the signal $(N_1)$ at the reset level of $C_{FD}$ or the signal $N_2''$ of a subsequent frame in place of the signal $(N_2)$ at the reset level of $C_{FD}+C_S$, a differential amplifier 63 takes a second differential component between the voltage signal $(S_1'+S_2'+N_2)$, resulting from the photoelectric charges transferred to the floating diffusion region and the storage capacitor element, and the voltage signal $(N_1)$ at the reset level of the floating diffusion region or the voltage signal $N_2''$ at the reset level of the floating diffusion region and the storage capacitor element in the subsequent frame as shown in FIG. 23B. A gain A3 allows the second differential component to match an input voltage range of an AD converter ADC 6 that digitizes the second differential component and outputs a high-illuminance signal data $V_2$.

A difference occurs in $V_1$ and $V_2$, obtained in the manner set forth above, by a value corresponding to $C_{FD}$ of the floating diffusion region FD of the CMOS image sensor with the same light intensities.

Figure 24:
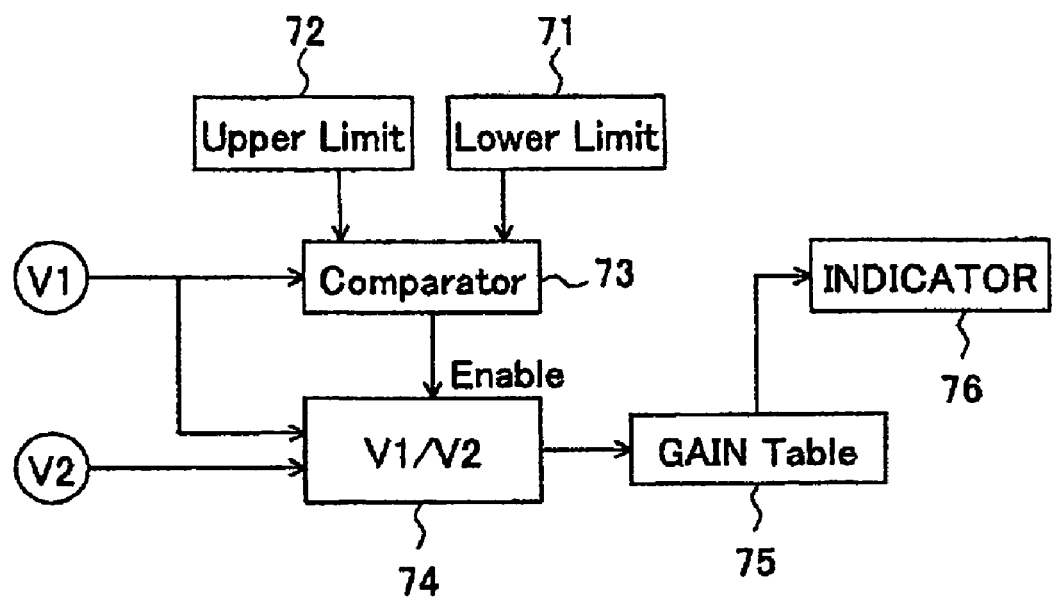
FIG. 24 is a block diagram showing a structure of a gain table generating section of the CMOS image sensor of the fourth embodiment according to the present invention.

FIG. 24 is a block diagram showing a structure of the gain table generating section 70.

The gain table generating section 70 serves to generate a gain table for gains to be set for respective pixels in response to the differential components ($V_1$ and $V_2$), obtained in the manner described above, and includes a lower limit setting section 71, an upper limit setting section 72, a comparator 73 and a subtraction block 74 for generating the gain table 75.

The comparator 73 makes comparison between a value of the low-illuminance signal data $V_1$ and values of the lower limit setting section 71 and the upper limit setting section 72 and outputs an enable signal Enable to the subtraction block 74 when an output of the comparator 73 falls in a given range preset by the lower limit setting section 71 and the upper limit setting section 72.

When this takes place, the subtraction block 74 calculates a ratio of $V_1 N_2$ and generates a gain table 75 for updating. Upon generation and updating of the gain table 75, an indicator 76 is effectuated and enables an application-site to use a value of the gain table 75. The gain table generating section 70 can suppress variation in gain of the floating diffusion region FD for thereby suppressing the occurrence of fixed pattern noise during switchover between $V_1$ and $V_2$.

Further, for the gain table previously mentioned, preliminarily supposed values of $V_1/V_2$ are written in and when generating the gain table or before updating the same at timing such as when making power activation, the shooting can be made without uncomfortable feeling.

Figure 25:
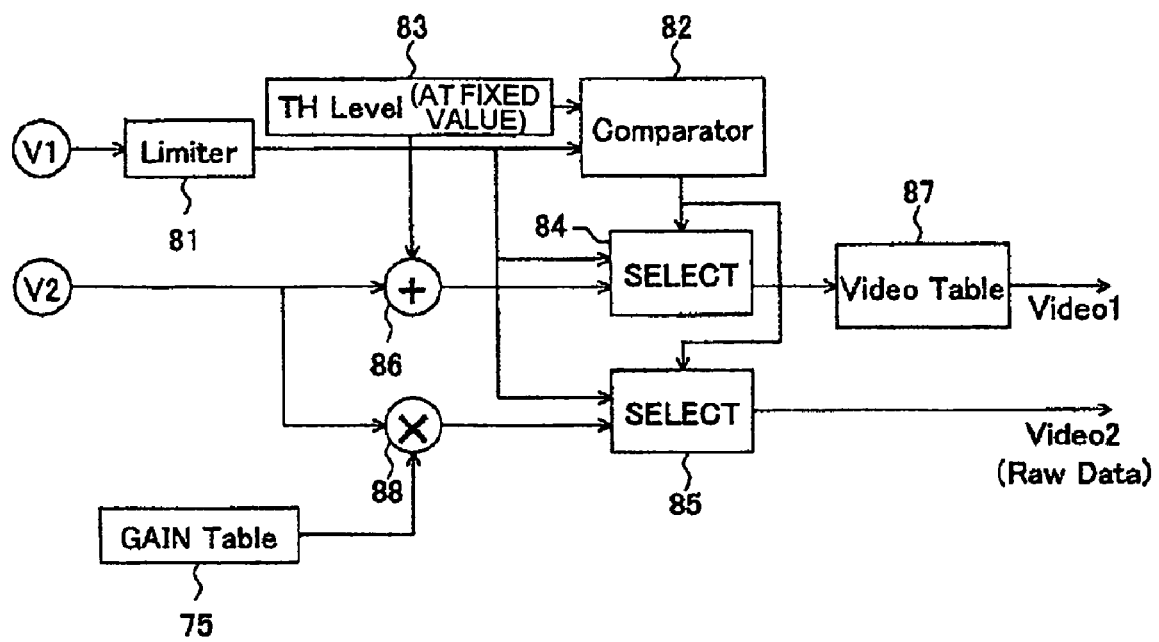
FIG. 25 is a block diagram showing a structure of a video data synthesizing section of the CMOS image sensor of the fourth embodiment according to the present invention.

FIG. 25 is a block diagram showing a structure of the video data synthesizing section 80 for generating the outputs (Video1, Video2) in two lines.

First, the low-illuminance signal data $V_1$ is applied to a limiter 81 for suppressing variation in a saturation level for each pixel. A comparator 82 makes comparison between a threshold value, preset in a threshold value (TH level) setting section 83, and the low-illuminance signal data $V_1$ and generates a data selection signal for selectors (84, 85).

The selector 84 selects either one of the low-illuminance signal data $V_1$ with further increased resolution and the high-illuminance signal data $V_2$ with capability of a larger amount of charge information, to which a value of the threshold level, preset by the threshold value setting section 83, is added by an adding block 86 depending on the data selection signal delivered from the comparator 82 to output selected data to a video table 87.

The video table 87 stores therein gamma curves needed on applications and the video signal Video1 is output referring to such curves.

The other video signal Video2 handles linear data covering a range from low illuminance to high illuminance.

Gain data is read out from the gain table 75, generated by the gain table generating section 70, and multiplied by a multiplication block 88 by the high-illuminance signal data $V_2$. This represents that the high-illuminance signal data $V_2$ has the same gradient as that of the low-illuminance signal data $V_1$ and provides a linearly numeric value as an output of Video2 in an entire light intensity range for the CMOS image sensor to handle. If a shooting object is in low illuminance, the selector 85 selects the low-illuminance signal data $V_1$ with high resolution. The signal is selected in the same operation as that in which the video signal Video1 is selected.

The output on the Video2-line has the same gain variation for each pixel as that of the video signal Video1. This allows the output to be generated in the form in which a discontinuous gain, caused when switching over the low illuminance signal to the high illuminance signal, is corrected. This enables reduction in fixed pattern noise appearing during switchover between two information.

In the CMOS image sensor of the present embodiment set forth above, in addition to an increase in a dynamic range resulting from the provision of the storage capacitor element $C_S$ connected to the photodiode via the transistor in each pixel, information on low illuminance and information on high illuminance are synthesized while canceling variation in gain of the floating diffusion region for thereby enabling the suppression of fixed pattern noise appearing during switchover between two information.

In addition to the above, the subtraction block 74 and the multiplication block 88 are possible to include OB-level corrections, respectively.

Fifth Embodiment

Figure 26:
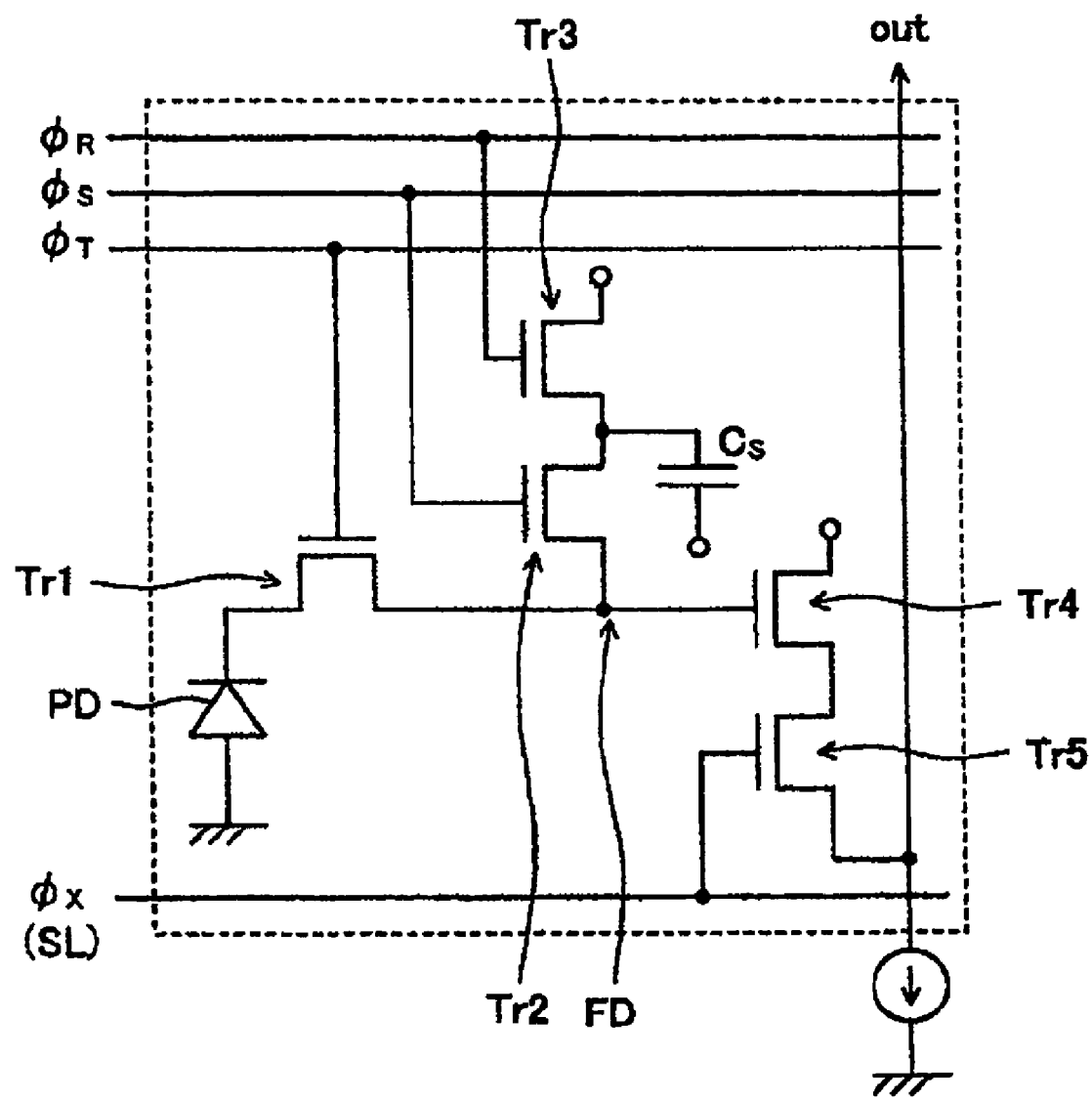
FIG. 26 is an equivalent circuit diagram of one pixel of a CMOS image sensor of a fifth embodiment according to the present invention.

A solid-state imaging device of the present embodiment includes a CMOS image sensor of the same structure as that of the first embodiment and FIG. 26 is an equivalent circuit diagram for one pixel.

Each pixel includes a photodiode PD for generating photoelectric charges on receipt of light and accumulating the same, a transfer transistor Tr1 for transferring the photoelectric charges from the photodiode PD, a floating diffusion region FD to which the photoelectric charges are transferred via the transfer transistor Tr1, a storage capacitor element $C_S$ for accumulating photoelectric charges overflowing from the photodiode during accumulating operation, an accumulation transistor Tr2 for coupling or splitting potentials of the floating diffusion region FD and the storage capacitor element $C_S$, a reset transistor Tr3 connected to the floating diffusion region FD via the accumulation transistor Tr2 for discharging the photoelectric charges from the storage capacitor element $C_S$ and the floating diffusion region FD, an amplifying transistor Tr4 for amplifying and converting the photoelectric charges of the floating diffusion region FD to a voltage signal, and a selection transistor Tr5 connected to the amplifying transistor for selecting a pixel. Thus, a CMOS image sensor of a so-called five-transistor type is formed in a structure. For instance, any of the five transistors mentioned above includes an N-channel MOS transistor.

The CMOS image sensor of the present embodiment includes an integrated array of the plural pixels formed in the structure described above. With each pixel, the transfer transistor Tr1, the accumulation transistor Tr2 and the reset transistor Tr3 have gate electrodes connected to drivelines $\Phi_T$, $\Phi_S$, $\Phi_R$, respectively. Also, the selection transistor Tr5 has a gate electrode connected to a pixel selection line SL ($\Phi_X$) adapted to be driven by a line shift register. Further, the selection transistor Tr5 has a source and drain on an output to which an output line "out" is connected and is controlled by a row shift register to provide an output.

Since the selection transistor Tr5 and the driveline $\Phi_X$ may be suffice to fix a voltage of the floating diffusion region FD to an appropriate value so as to enable the operations to select or not to select a pixel, these components may be possibly omitted.

Figure 27:
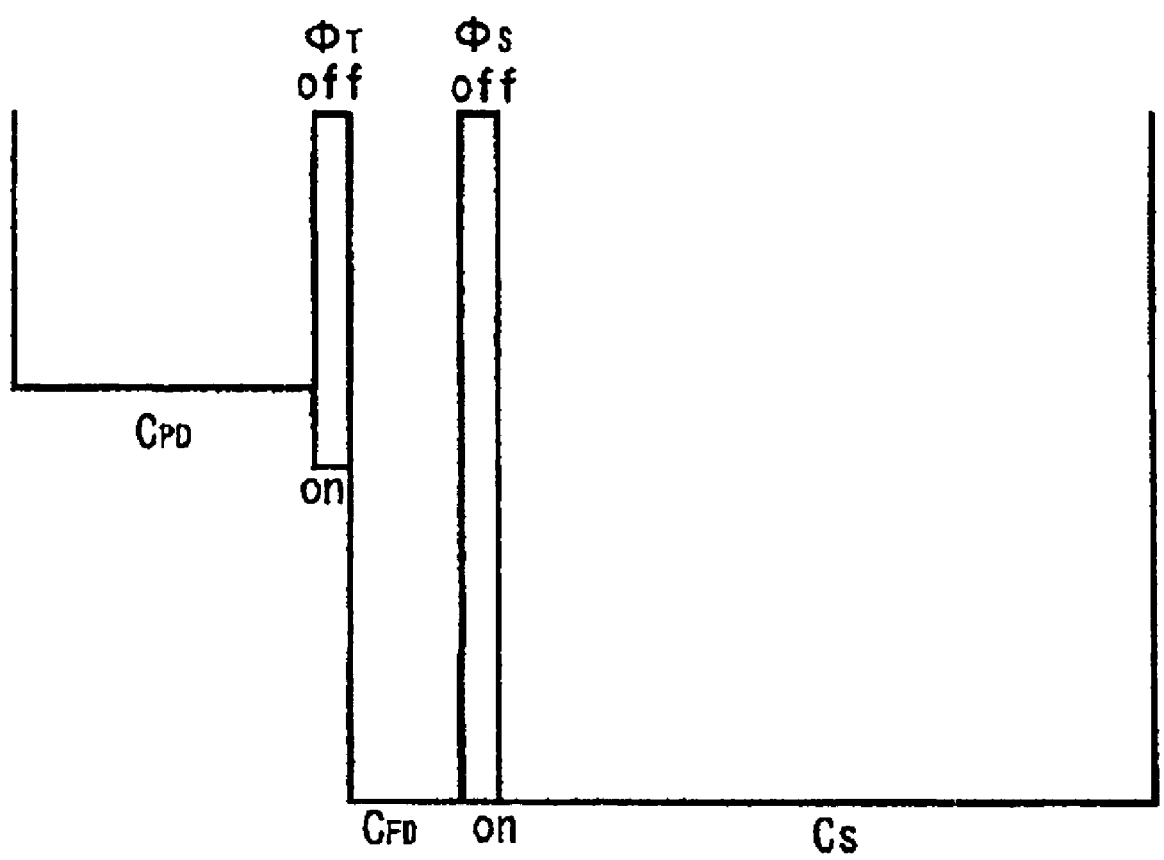
FIG. 27 is a typical potential diagram of an essential part of the CMOS image sensor of the fifth embodiment according to the present invention.

FIG. 27 is a typical potential diagram corresponding to the photodiode PD, the transfer transistor Tr1, the floating diffusion region FD, the accumulation transistor Tr2 and the storage capacitor element $C_S$ mentioned above.

The photodiode PD forms a capacitor $C_{PD}$ with a potential that is relatively shallow and the floating diffusion region FD and the storage capacitor $C_S$ form capacitors ($C_{FD}$, $C_S$) each with a potential that is relatively deep.

Here, the transfer transistor Tr1 and the accumulation transistor Tr2 may take two levels depending on on/off states of the transistors.

Description is made of a method of driving the CMOS image sensor of the present embodiment described with reference to the illustrated equivalent circuit diagram of FIG. 26 and the potential diagram of FIG. 27.

Figure 28:
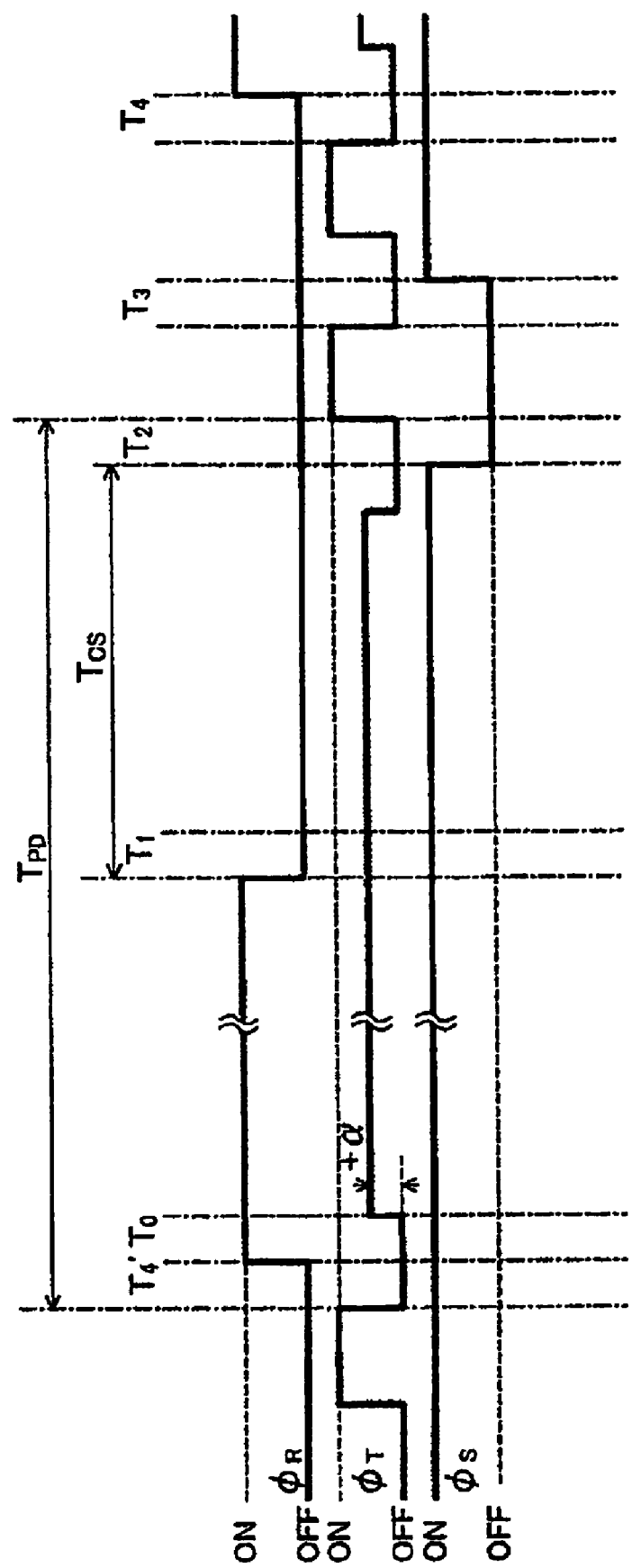
FIG. 28 is a timing chart of voltages applied to drivelines ($\Phi_T$, $\Phi_S$, $\Phi_R$) of the CMOS image sensor of the fifth embodiment according to the present invention.

FIG. 28 is a timing chart showing voltages applied to the drivelines ($\Phi_T$, $\Phi_S$, $\Phi_R$) in two levels for on/off states with $\Phi_T$ having three levels additionally including a level represented by (+α).

The voltage applied to the driveline $\Phi_T$ may take the two levels for ON/OFF states and may preferably take the three levels as represented in the present example for enabling the floating diffusion region FD and the storage capacitor element $C_S$ to efficiently capture and accumulate the charges overflowing from the photodiode PD.

FIGS. 29A to 29D and FIGS. 30A to 30C correspond to potential diagrams at respective timings of timing charts.

Figure 29A:
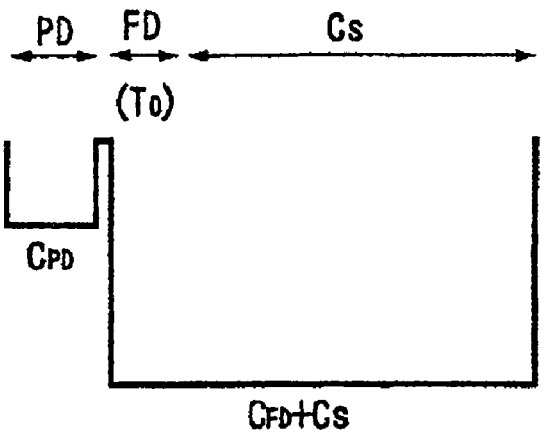
FIGS. 29A to 29D correspond to potential diagrams for respective timings in the timing chart of FIG. 28 for the CMOS image sensor of the fifth embodiment according to the present invention.

As shown in FIG. 29A, first, at time $T_0$ when a new field begins, $\Phi_R$ is set to be on under a condition where $\Phi_T$ is set to be off and $\Phi_S$ is set to be on and the photoelectric charges generated in a preceding field are entirely discharged for resetting.

An accumulation time period (corresponding to a substantially imaging period) of $C_{PD}$ begins at a time point ($T_4'$) at which $\Phi_T$ is set to be off immediately before time $T_0$ and $C_{PD}$ begins to accumulate the photoelectric charges.

Also, for the reason described above, immediately after time $T_0$, $\Phi_T$ is set to have the level (+α).

Next, at time $T_1$ after an elapse of a given time interval from the beginning of an image time interval, $\Phi_R$ is set to be off.

Figure 29B:
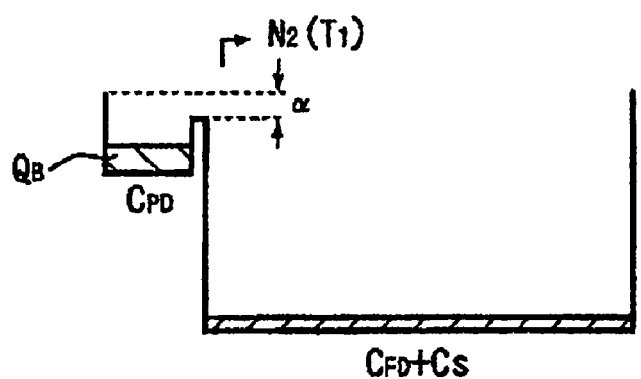

At this moment, as shown in FIG. 29B, $\Phi_S$ is set to be on with the resultant coupling between $C_{FD}$ and $C_S$ and immediately after resetting, so-called kTC noise occurs in $C_{FD}+C_S$ with the occurrence of resetting operation. Here, a signal of $C_{FD}+C_S$ at a reset level is read out as noise $N_2$.

At time $T_1$, the storage-capacitor-element accumulation period $T_{CS}$ for $C_S$ has begun and $C_S$ begins to accumulate the photoelectric charges overflowing from the photodiode PD.

Also, since a given time interval has elapsed from the beginning of the imaging period interval as set forth above, FIG. 29B shows a status in which $C_{PD}$ accumulates the pre-saturated charges $Q_B$ to some extent.

Thus, under a situation where the photoelectric charges lies at a level less than that saturating $C_{PD}$, the photoelectric charges are accumulated only in $C_{PD}$ and if the photoelectric charges lie at a level greater than that saturating $C_{PD}$, the photoelectric charges are accumulated, in addition to $C_{PD}$, in $C_{FD}$ and $C_S$.

Figure 29C:
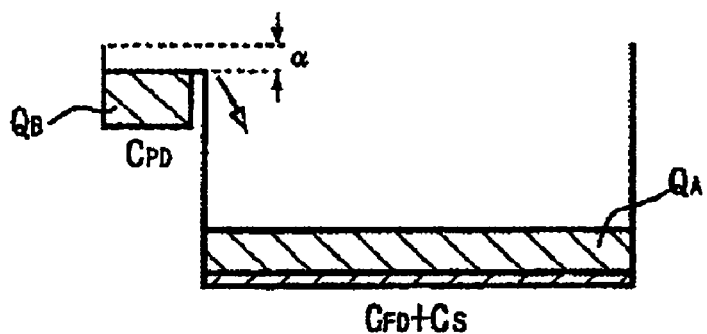

FIG. 29C shows a saturated status of $C_{PD}$ wherein $C_{PD}$ accumulates the pre-saturated charges $Q_B$ and $C_{FD}$ and $C_S$ accumulates the supersaturated charges $Q_A$.

Figure 29D:
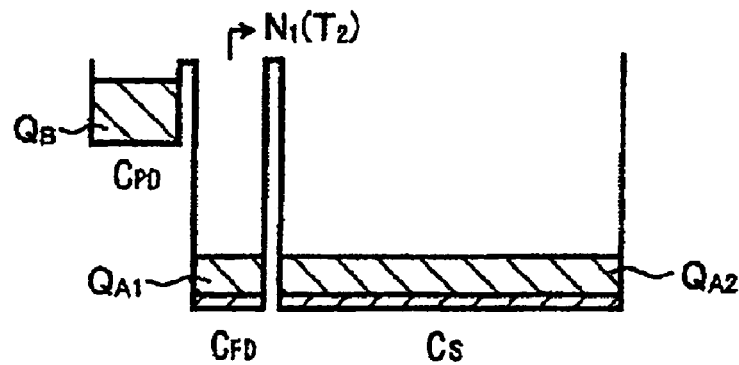

Then, at the end of the storage-capacitor-element accumulation period $T_{CS}$, $\Phi_T$ is returned from the level (+α) to an off status and, further, at time $T_2$, $\Phi_S$ is set to be off to split the potential of $C_{FD}$ and $C_S$ as shown in FIG. 29D. At this moment, the supersaturated charges QA are split into potentials $QA_1$ and $QA_2$ depending on a capacitance ratio between $C_{FD}$ and $C_S$. Here, a signal appearing at a reset level in $C_{FD}$ in which a part $QA_1$ of the super saturated charges is read out as noise $N_1$.

Figure 30A:
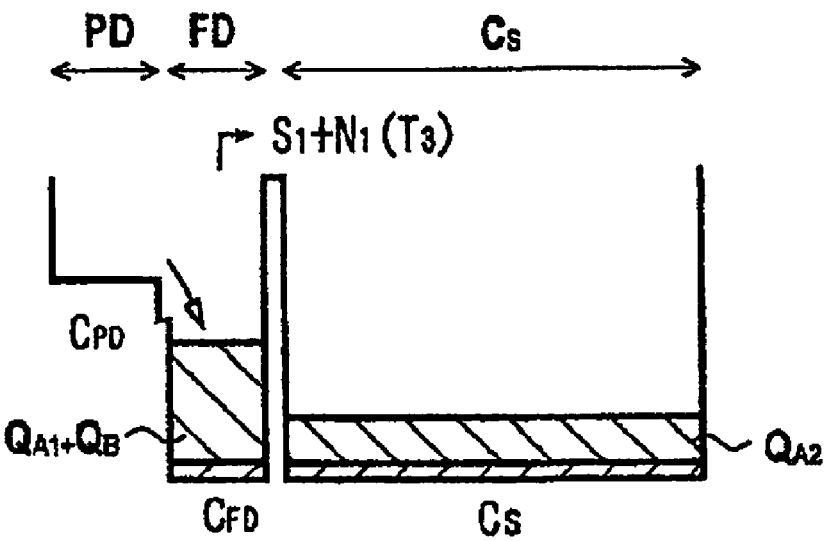
FIGS. 30A to 30C correspond to potential diagrams for respective timings in the timing chart of FIG. 28 for the CMOS image sensor of the fifth embodiment according to the present invention.

Subsequently, $\Phi_T$ is set to be on and pre-saturated charges $Q_B$ are transferred from $C_{PD}$ to $C_{FD}$ for mixing with the part $QA_1$ of the super saturated charges originally stored in $C_{FD}$ as shown in FIG. 30A.

Here, since $C_{PD}$ has a potential shallower than that of $C_{FD}$ and the transfer transistor has a level deeper than that of $C_{PD}$, a complete charge transfer can be realized transferring all of the pre-saturated charges $Q_B$ from $C_{PD}$ to $C_{FD}$.

Then, $\Phi_T$ is returned to be off at time $T_3$ and a pre-saturated charge signal $S_1$ is read out from the pre-saturated charges $Q_B$ transferred to $C_{FD}$. However, since a sum of charges of the pre-saturated charges $Q_B$ and the part $QA_1$ of the super saturated charges are present in $C_{FD}$, what is read out results in consequence of $S_1+N_1$. FIG. 30A shows a status appearing before $\Phi_T$ is returned to be off.

Figure 30B:
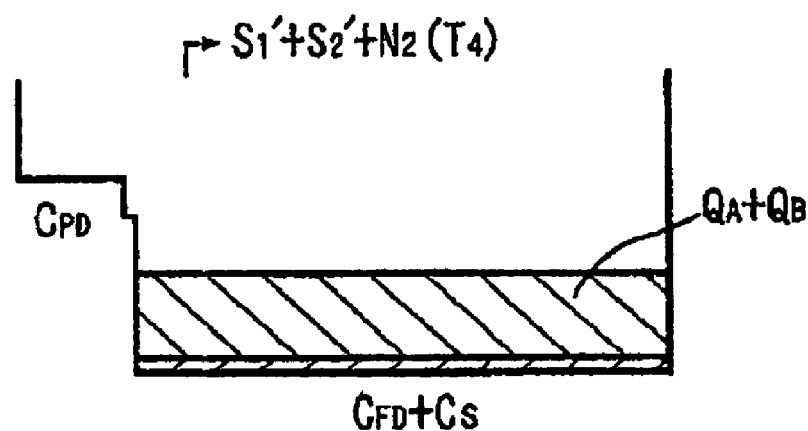
Figure 30C:
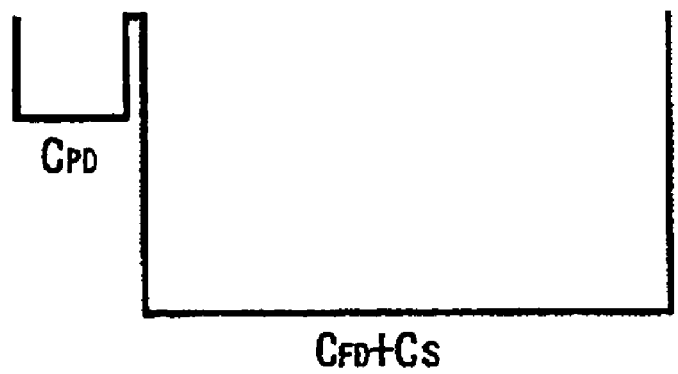

Next, $\Phi_S$ is set to be on and, consecutively, $\Phi_T$ is set to be on to couple the potentials of $C_{FD}$ and $C_S$ such that the sum of the charges of the pre-saturated charges $Q_B$ and the part $QA_1$ of the super saturated charges in $C_{FD}$ and the part $QA_2$ of the super saturated charges in $C_S$ are mixed as shown in FIG. 30B. The sum of the part $QA_1$ of the super saturated charges and the part $QA_2$ of the super saturated charges corresponds to the super saturated charges QA appearing before the splitting thereof and, hence, a signal of a sum of the pre-saturated charges $Q_B$ and the super saturated charges $Q_A$ is accumulated in a coupled potential between $C_{FD}$ and $C_S$.

Here, $\Phi_T$ is returned to be off at time $T_4$ and a signal of a sum of the pre-saturated charge signal $S_1$ and the supersaturated charge signal $S_2$ is read out from a value of the pre-saturated charges $Q_B$+the supersaturated charges $Q_A$ that are spread in $C_{FD}+C_S$. However, here, due to the presence of $C_{FD}+C_S$ noise and the signal read out from the charges spread in $C_{FD}+C_S$, what is actually read out results in consequence of $S_1'+S_2'+N_2$ (with $S_1'$ and $S_2'$ resulting from values of $S_1$ and $S_2$ compacted and modulated at a capacitance ratio between $C_{FD}$ and $C_S$, respectively). FIG. 30B shows a status appearing before $\Phi_T$ is returned to be off.

With the above, one field is completed and the operation is caused to shift to a subsequent field wherein $\Phi_T$ is set to be off and $\Phi_S$ is set to be on and all of the photoelectric charges, caused in the preceding field, are discharged for resetting.

The pre-saturated charge signal ($S_1$) and the sum ($S_1+S_2$) of the pre-saturated charge signal and the saturated charge signal are obtained from the four signals $N_2$, $N_1$, $S_1+N_1$, $S_1'+S_2'+N_2$ obtained in the manner as previously mentioned in the same sequence as that of the first embodiment. Either one of these signals is selected depending on a status before saturation or a status after saturation.

While with the description set forth above, noise $N_2$ is read out and accumulated in the frame memory to allow noise $N_2$ to be utilized during generation of an image signal, noise $N_2$ is sufficiently lower than that occurring in the pre-saturated charges+the supersaturated charges during saturation and, so, noise $N_2$ in a subsequent frame may be used in place of noise $N_2$ of the current frame.

Figure 31:
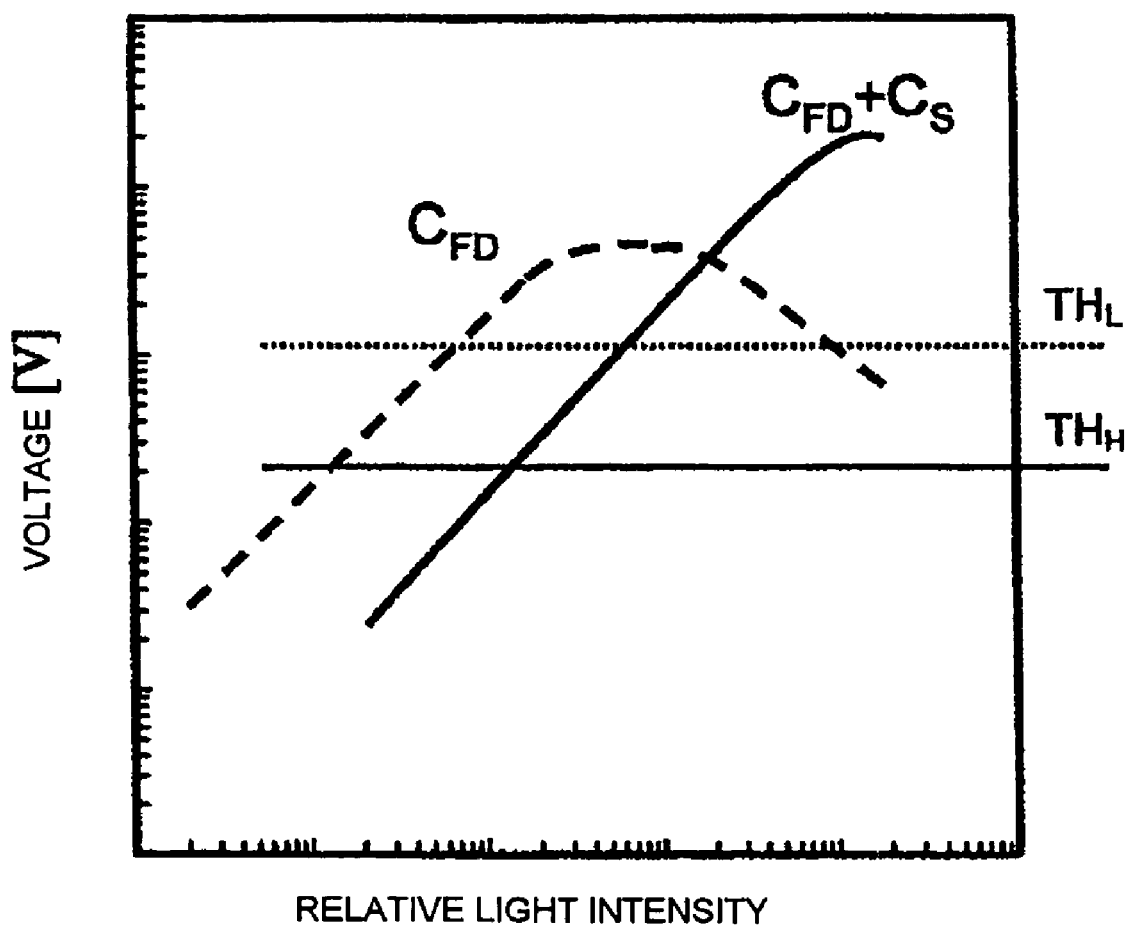
FIG. 31 is a view showing a graph of a low illuminance signal and a graph of a high illuminance signal plotted in an overlapped status for the CMOS image sensor of the fifth embodiment according to the present invention.

FIG. 31 is a view in which for the CMOS image sensor of the present embodiment, a graph (displayed in Curve $C_{FD}$) of a low-illuminance signal with a voltage of a floating diffusion region, employing a capacitance $C_{FD}$ as described above, plotted in terms of a relative light intensity and a graph (displayed in Curve $C_{FD}+C_S$) of a high-illuminance signal with the voltage of the floating diffusion region, employing a capacitance $C_{FD}+C_S$, plotted in terms of the relative light intensity and in which the two graphs are shown in an overlapped form.

However, using the capacitance $C_{FD}+C_S$ results in an increase in a capacitance by a value of $C_S$ even when obtaining the same number of charges upon irradiation of the same light intensity and a drop occurs in a voltage to be converted by that extent.

For example, with the voltage being set to a given threshold value, the low-illuminance signal $S_1$ represented by $C_{FD}$ in the graph is used in low illuminance until a voltage using $C_{FD}$ exceeds the threshold value whereas in high illuminance when the voltage exceeds the threshold value, the high-illuminance signal $S_1+S_2$ represented by $C_{FD}+C_S$ in the graph is selected and used.

However, like the present embodiment, with the CMOS image sensor with a widened dynamic range, a phenomenon is liable to occur wherein as the relative light intensity increases, the voltage also increases in the graph represented by $C_{FD}$ and saturation occurs in due course with no further increase in voltage after which as the relative intensity increases, the voltage decreases.

This is due to the fact in that as shown in FIGS. 29D and 30A, the pre-saturated charges are measured by handling a portion of the supersaturated charges as noise and a noise level increases with an increase in relative light intensity with the resultant consequence of a decrease in a range for the pre-saturated charges to be measured.

Upon the occurrence of the above phenomenon, even if a threshold value for making switchover between a low-illuminance signal and a high-illuminance signal is set, a light intensity becoming the above threshold value comes to be present in a region where a voltage exceeds a peak and then a drop occurs in the voltage whereby a difficulty is encountered in making judgment for a correct threshold value merely depending on whether or not the voltage appearing when using $C_{FD}$ exceeds the threshold value.

Therefore, under a situation where the above phenomenon occurs, a threshold value $TH_L$ of a signal for low illuminance (when using $C_{FD}$) and a threshold value $TH_H$ of a signal for high illuminance (when using $C_{FD}+C_S$) are set to respective levels. Under a situation where both the signals become less than the respective threshold values, the low-illuminance signal $S_1$ designated by $C_{FD}$ in the graph is used. Under a situation where either one of the both signals exceeds the threshold voltage, the low-illuminance signal $S_1$ designated by $C_{FD}+C_S$ in the graph is used.

With the CMOS image sensor of the present embodiment, like the first embodiment, a high S/N ratio can be maintained and a wide dynamic range can be realized in high illuminance.

Sixth Embodiment

A CMOS image sensor of the present embodiment takes a structure of the CMOS image sensors of the first to fifth embodiments, described above, wherein each pixel (Pixel) is arranged to output a low-illuminance signal and a high-illuminance signal in a multiplexing mode.

Figure 32:
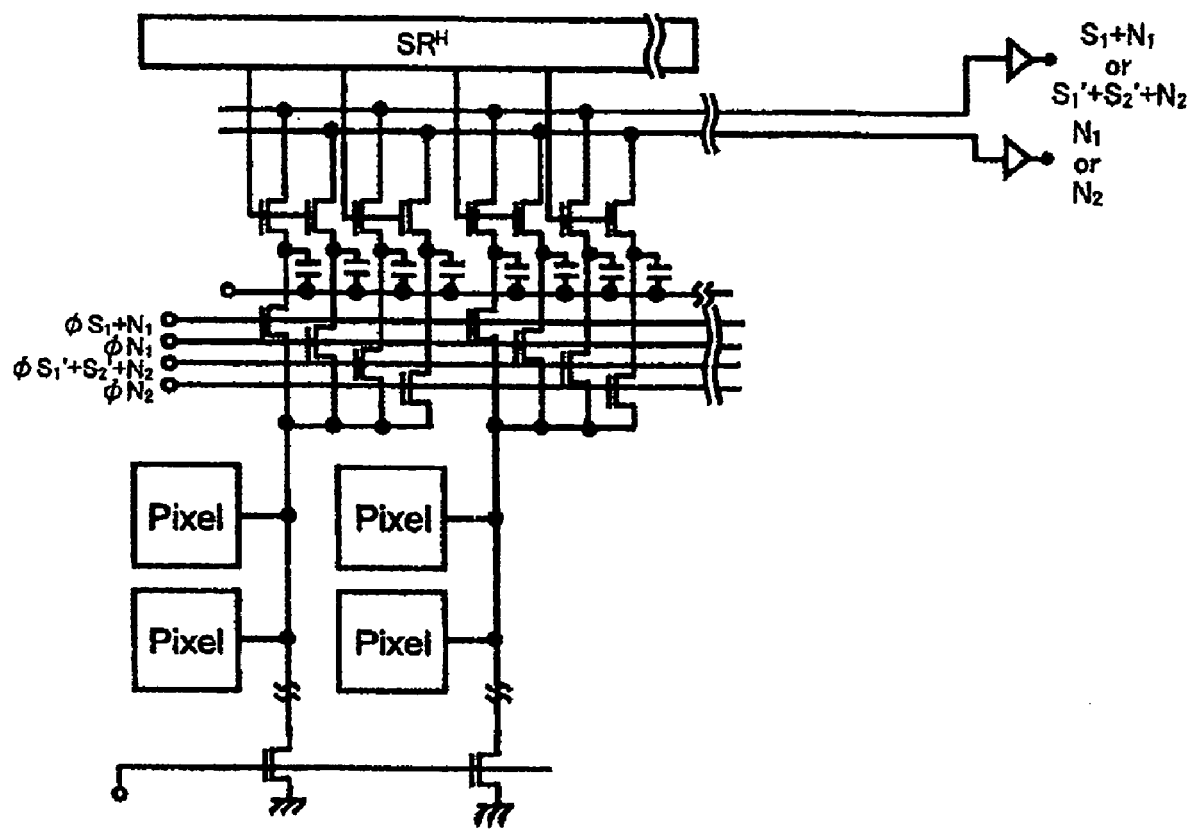
FIG. 32 is an equivalent circuit diagram showing an overall circuit structure of a CMOS image sensor of a sixth embodiment according to the present invention.

FIG. 32 is an equivalent circuit diagram showing an overall circuit structure of the CMOS image sensor of the present embodiment. This image sensor is configured in substantially the same structure as that of the first embodiment shown in the equivalent circuit diagram of FIG. 11. The respective pixels (Pixel) are controlled by drivelines ($\Phi_{S+N1}$, $\Phi_{N1}$, $\Phi_{S1'+S2''+N2}$, $\Phi_{N2}$). Thus, in accordance with timings controlled by clocks, one output line outputs a pre-saturated charge signal $(S_1)$+ $C_{FD}$ noise $(N_1)$ and a modulated pre-saturated charge signal $(S_1')$+a modulated supersaturated charge signal $(S_2')$+$C_{FD}$+$C_S$ noise $(N_2)$, respectively, and other output line outputs $C_{FD}$ noise $(N_1)$ and $C_{FD}$+$C_S$ noise $(N_2)$, respectively, in accordance with timings controlled by clocks.

In the CMOS image sensor of the present embodiment, a reduction in the number of output lines can be achieved to simplify a circuitry of an output system with the resultant reduction in the number of terminals of external chips on the support of such outputs. For instance, with one sheet of an external chip having two input terminals, two sheets of external chips may be possibly reduced to one sheet.

Seventh Embodiment

A CMOS image sensor of the present embodiment is a CMOS image sensor in correspondence to the CMOS image sensors of the first to sixth embodiments, described above, in which gain control for a high-illuminance signal is performed in a manner described below.

Figure 33:
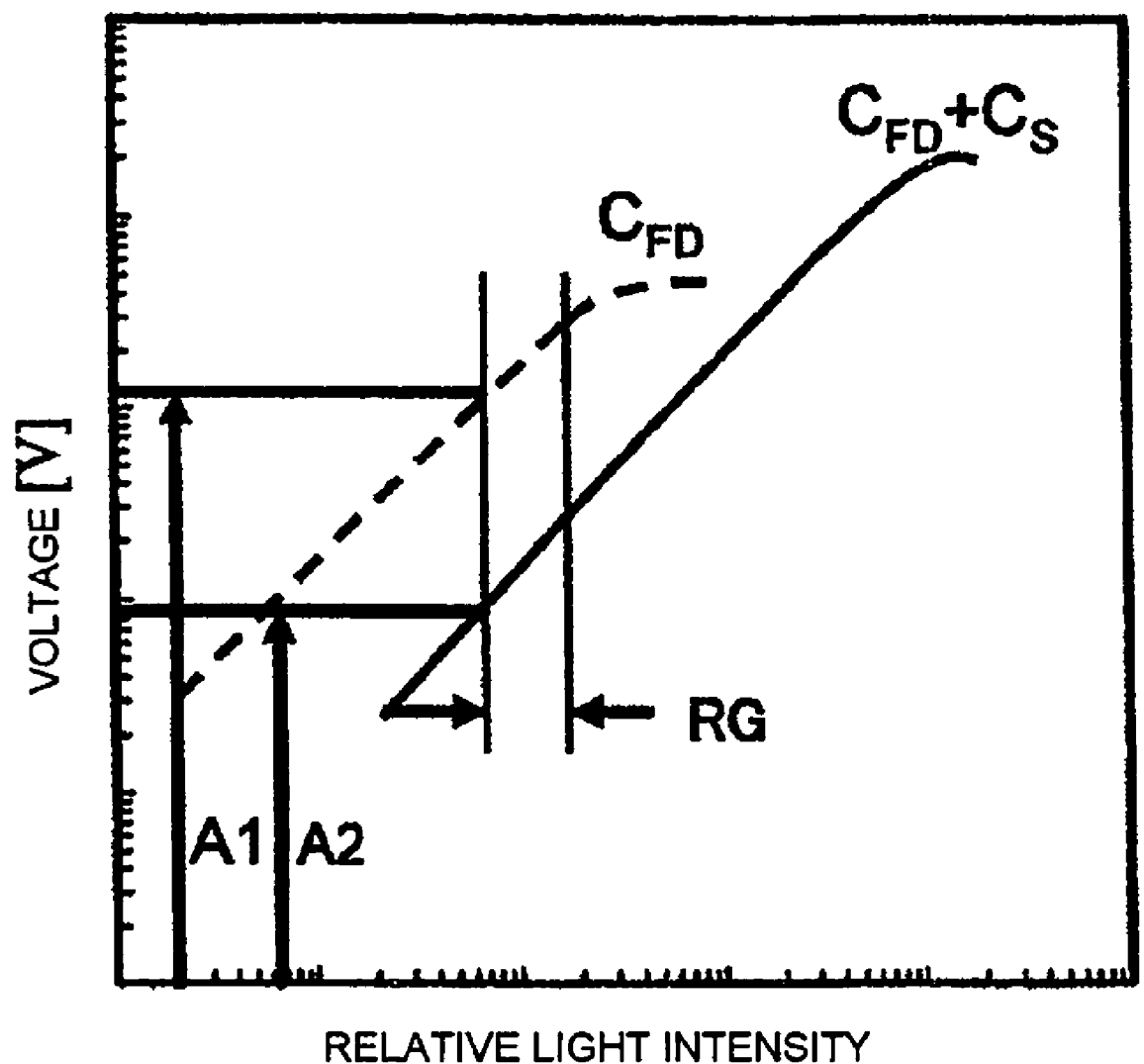
FIG. 33 is a view showing a graph of a low illuminance signal and a graph of a high illuminance signal plotted in an overlapped status for a CMOS image sensor of a seventh embodiment according to the present invention.

FIG. 33 is a view wherein for the CMOS image sensor of the present embodiment, a graph (displayed in Curve $C_{FD}$) of a low-illuminance signal resulting from plotting a voltage of a floating diffusion region appearing when employing a capacitance $C_{FD}$, as described above, in terms of a relative light intensity is overlapped with a graph (displayed in Curve $C_{FD}$+$C_S$) of a high-illuminance signal resulting from plotting the voltage of the floating diffusion region appearing when employing a capacitance $C_{FD}$+$C_S$ in terms of the relative light intensity and in which the two graphs are shown in an overlapped form.

However, when using the capacitance $C_{FD}$+$C_S$, even if the same number of charges is obtained upon receipt of the same light intensity, a capacitance value increases by a value of $C_S$ and a drop occurs in a voltage to be converted by that extent. Therefore, when using the high-illuminance signal, a gain of this signal is regulated to the same gain as that of the pre-saturated charge signal $(S_1)$, playing a role as the low-illuminance signal, upon demodulation performed at a capacitance ratio between $C_{FD}$ and $C_S$ for thereby obtaining a sum $(S_1+S_2)$ of the pre-saturated charge signal, playing a role as the high-illuminance signal, and the supersaturated charge signal.

Now, for a method of obtaining a value of gain for demodulating the high-illuminance signal described above, the operation is executed to calculate an output ratio between the high-illuminance signal and the low-illuminance signal during a phase wherein the high-illuminance signal appears in a specified output zone RG as shown in FIG. 33.

For example, a ratio of A1/A2 is calculated based on values of a voltage A1 of the low-illuminance signal and a voltage A2 of the high-illuminance signal at certain light intensity within the above-described output zone RG in FIG. 33.

The resulting ratio is fed back as a gain and gain control is performed for the high-illuminance signal.

In the CMOS image sensor of the present embodiment, the gain can be calculated again for each time the shooting is performed with the resultant capability of obtaining correct gain at all times to perform gain control of the high-illuminance signal.

Eighth Embodiment

A CMOS image sensor of the present embodiment is a CMOS image sensor in correspondence to the CMOS image sensors of the first to seventh embodiments described above in which an improved continuity during switchover between a low-illuminance signal and a high-illuminance signal is achieved in a manner described below.

Figure 34A:
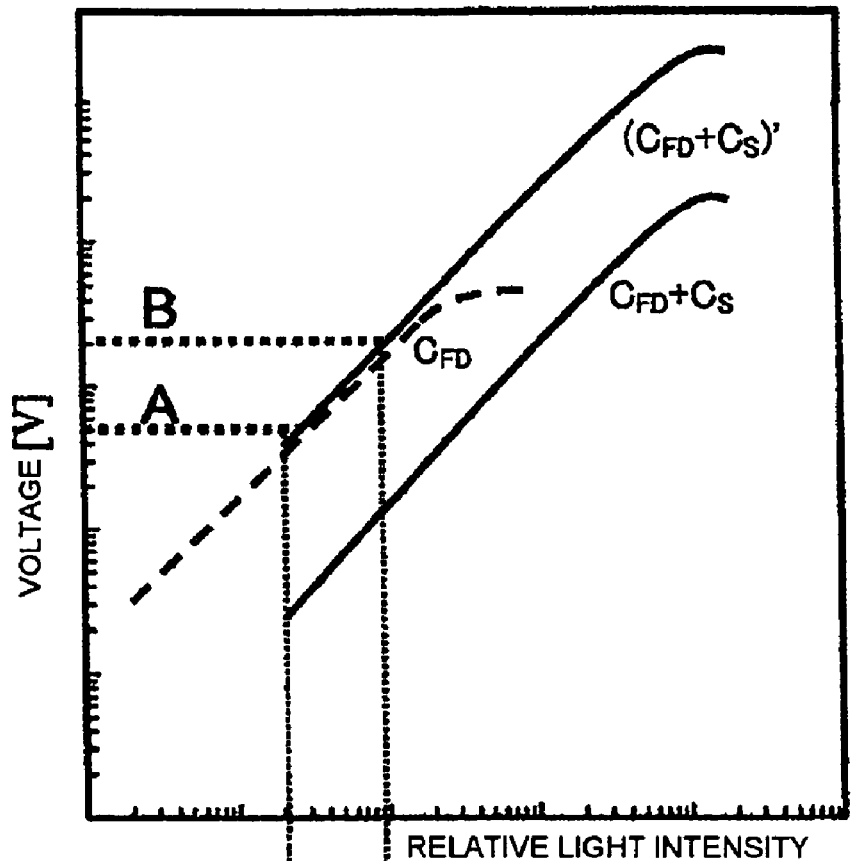
FIG. 34A is a view showing a graph of a low illuminance signal, a graph of a high illuminance signal and a graph resulting from demodulating the graph of the high illuminance signal plotted in an overlapped status for a CMOS image sensor of an eighth embodiment according to the present invention

FIG. 34A is a view in which for the CMOS image sensor of the present embodiment, a graph (displayed in Curve $C_{FD}$) of a low-illuminance signal resulting from plotting a voltage of a floating diffusion region, employing a capacitance $C_{FD}$ as described above, in terms of a relative light intensity is overlapped with a graph (displayed in Curve $C_{FD}$+$C_S$) of a high-illuminance signal resulting from plotting the voltage of the floating diffusion region, employing a capacitance $C_{FD}$+$C_S$, in terms of the relative light intensity and a graph (displayed in (Curve $C_{FD}$+$C_S$)') obtained by demodulating the graph of the high-illuminance signal at a given gain.

A difference is probable to exist between the graphs of the low-illuminance signal and the high-illuminance signal even in the presence of gain control and if switchover is made from the low-illuminance signal to the high-illuminance signal at a threshold value laying at a certain voltage potential, a difference occurs at the relevant switchover point with the resultant occurrence of discontinuity.

Figure 34B:
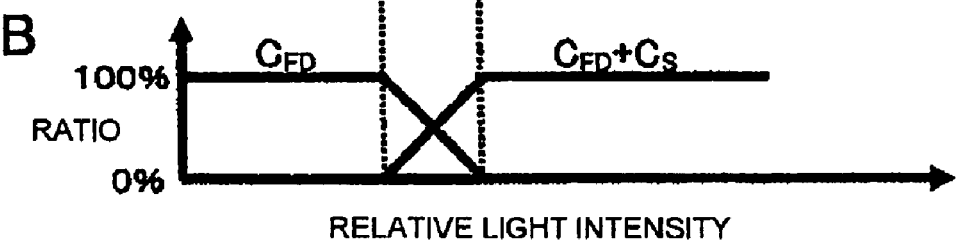
FIG. 34B is a graph showing a mixture ratio between the low illuminance signal and the high illuminance signal plotted in terms of relative light intensity.

In the present embodiment, as shown in a graph of a ratio plotted in terms of relative light intensity shown in FIG. 34B, with an output voltage A, 100% of the low-illuminance signal $(C_{FD})$ is employed and with an output voltage B, 100% of the high-illuminance signal $(C_{FD}+C_S)$ is employed while in a region between these voltages, the low-illuminance signal $(C_{FD})$ and the high-illuminance signal $(C_{FD}+C_S)$ are mixed and used at a given ratio.

This enables a smooth shift from the low-illuminance signal to the high-illuminance signal with the resultant capability of increasing continuity.

The present invention is not limited to the descriptions given above.

For instance, while the embodiments have been described with reference to the solid state imaging devices, the present invention is not limited to these devices and may be applied to a line sensor, composed of linearly arrayed pixels of respective solid-state imaging devices, and an optical sensor, configured in a structure including a pixel of each solid-state imaging device in a single unit intact, which can achieve a widened dynamic range with high sensitivity and a high S/N ratio that would be difficult to be achieved in the related art.

Further, no particular limitation is intended on a shape of the storage capacitor element and various methods, heretofore developed with a view to increasing a capacitance with the use of a DRAM and a memory capacitor, can be adopted.

The solid-state imaging device may be suffice to take a structure wherein the photo diode and the storage capacitor element, adapted to accumulate the photoelectric charges overflowing from the photodiode, are connected via the transfer transistor and may take application to, in addition to a CMOS image sensor, a CCD.

In addition, various modifications may be possible without departing from the scope of the present invention.

INDUSTRIAL APPLICABILITY

A solid-state imaging device of the present invention can be applied to image sensors, needed to have a wide dynamic range, such as a CMOS image sensor or a CCD image sensor to be loaded on a digital camera and a cell-phone with a camera or the like.

An optical sensor of the present invention can be applied to an optical sensor that needs a wide dynamic range.

A method of operating a slid-state imaging device according to the present invention can be applied a method of operating an image sensor that needs a wide dynamic range.

The invention claimed is:

1. A method of operating a solid-state imaging device having an integrated array of a plurality of pixels, each pixel having a photodiode for receiving light and generating and accumulating photoelectric charges, a transfer transistor and an accumulation transistor for transferring said photoelectric charges, a floating diffusion region coupled to said photodiode via said transfer transistor, and a storage capacitor element accumulating photoelectric charges, overflowing from said photodiode, via said transfer transistor and said accumulation transistor in an accumulating period of said photodiode to allow said accumulation transistor to control coupling or splitting of a potential with respect to said floating diffusion region, said operating method comprising:

turning off said transfer transistor prior to accumulating a charge and turning on said accumulation transistor for discharging said photoelectric charges from said floating diffusion region and said storage capacitor element;

reading out a voltage signal at a reset level of said floating diffusion region and said storage capacitor element;

accumulating pre-saturated charges, among said photoelectric charges occurring in said photodiode, in said photodiode and accumulating supersaturated charges, overflowing from said photodiode, in said floating diffusion region and said storage capacitor element in a storage-capacitor-element accumulation period that is set to be a period at a predetermined ratio with respect to said accumulation period of said photodiode;

turning off said accumulation transistor to split potentials of said floating diffusion region and said storage capacitor element and discharging said photoelectric charges from said floating diffusion region;

reading out a voltage signal at a reset level of said floating diffusion region;

turning on said transfer transistor to transfer said pre-saturated charges to said floating diffusion region and reading out a voltage signal including said pre-saturated charges; and turning on said accumulation transistor to couple the potentials of said floating diffusion region and said storage capacitor element and reading out a voltage signal including said pre-saturated charges and said supersaturated signal.

2. A method of operating a solid-state imaging device having an integrated array of a plurality of pixels, each pixel having a photodiode for receiving light and generating and accumulating photoelectric charges, a transfer transistor and an accumulation transistor for transferring said photoelectric charges, a floating diffusion region coupled to said photodiode via said transfer transistor, and a storage capacitor element accumulating photoelectric charges, overflowing from said photodiode, via said transfer transistor and said accumulation transistor in an accumulating period of said photodiode to allow said accumulation transistor to control coupling or splitting a potential with respect said floating diffusion region, said operating method comprising:

turning off said transfer transistor prior to accumulating a charge and turning on said accumulation transistor for discharging said photoelectric charges from said floating diffusion region and said storage capacitor element;

reading out a voltage signal at a reset level of said floating diffusion region and said storage capacitor element;

accumulating pre-saturated charges, among said photoelectric charges occurring in said photodiode, in said photodiode and accumulating supersaturated charges, overflowing from said photodiode, in said floating diffusion region and said storage capacitor element;

turning off said accumulation transistor to split potentials of said floating diffusion region and said storage capacitor element and discharging said photoelectric charges from said floating diffusion region;

reading out a voltage signal at a reset level of said floating diffusion region;

permitting said floating diffusion region, under a status where the potential is split between said storage capacitor element and said floating diffusion region, to accumulate ultra-supersaturated charges overflowing from said photodiode in a floating diffusion region accumulation period that is set to be a period at a predetermined ratio with respect to an accumulation period of said photodiode;

reading out a voltage signal including said ultra-supersaturated charges;

turning on said transfer transistor to transfer said pre-saturated charges to said floating diffusion region and reading out a voltage signal including said pre-saturated charges; and turning on said accumulation transistor to couple the potentials of said floating diffusion region and said storage capacitor element and reading out a voltage signal including said pre-saturated charges and said supersaturated signal.

* * * * *